(12) United States Patent
Tanifuji et al.

(10) Patent No.: US 10,982,318 B2
(45) Date of Patent: Apr. 20, 2021

(54) ARC EVAPORATION SOURCE

(71) Applicant: Kobe Steel, Ltd., Kobe (JP)

(72) Inventors: Shinichi Tanifuji, Kobe (JP); Kenji Yamamoto, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 341 days.

(21) Appl. No.: 16/110,095

(22) Filed: Aug. 23, 2018

(65) Prior Publication Data

US 2018/0371605 A1  Dec. 27, 2018

Related U.S. Application Data

(63) Continuation of application No. 14/001,315, filed as application No. PCT/JP2012/054451 on Feb. 23, 2012, now abandoned.

(30) Foreign Application Priority Data

Feb. 23, 2011 (JP) ................................ 2011-037094
Feb. 23, 2011 (JP) ................................ 2011-037095
(Continued)

(51) Int. Cl.
*H01J 37/32* (2006.01)
*C23C 14/24* (2006.01)
(Continued)

(52) U.S. Cl.
CPC ............ *C23C 14/24* (2013.01); *C23C 14/325* (2013.01); *H01J 37/32055* (2013.01);
(Continued)

(58) Field of Classification Search
CPC .................. H01J 37/3452; H01J 37/32055
See application file for complete search history.

(56) References Cited

U.S. PATENT DOCUMENTS 4,891,560 A * 1/1990 Okumura ............ H01J 37/3266
                                                          204/298.19
5,843,293 A   12/1998 Murakami et al.
(Continued)

FOREIGN PATENT DOCUMENTS

| CN | 101445915 A | 6/2009 |
| EP | 1 020 541 A2 | 7/2000 |

(Continued)

OTHER PUBLICATIONS

Written Opinion of the International Searching Authority dated Feb. 23, 2011 in PCT/JP12/054451 Filed Feb. 23, 2011.

(Continued)

*Primary Examiner* — Jason Berman
(74) *Attorney, Agent, or Firm* — Oblon, McClelland, Maier & Neustadt, L.L.P.

(57) ABSTRACT

An arc evaporation source (101) according to one embodiment of the present invention comprises: a ring-shaped circumferential magnet (103) which is so arranged as to surround the outer circumference of a target (102) along a direction in which the direction of magnetization becomes parallel with the front surface of the target; and a rear surface magnet (104) which is arranged on the rear surface side of the target (102) along a direction in which the direction of magnetization becomes perpendicular to the front surface of the target. The magnetic pole of the circumferential magnet (103) on the inner side in the radial direction and the magnetic pole of the rear surface magnet (104) on the target (102) side have the same polarity as each other.

14 Claims, 25 Drawing Sheets

(30) Foreign Application Priority Data

| | | |
|---|---|---|
| Apr. 25, 2011 | (JP) | 2011-097162 |
| May 26, 2011 | (JP) | 2011-118267 |
| Aug. 22, 2011 | (JP) | 2011-180544 |

(51) Int. Cl.
  *H01J 37/34* (2006.01)
  *C23C 14/32* (2006.01)

(52) U.S. Cl.
  CPC ........ *H01J 37/32669* (2013.01); *H01J 37/34* (2013.01); *H01J 37/3402* (2013.01); *H01J 37/345* (2013.01); *H01J 37/3452* (2013.01)

(56) References Cited

U.S. PATENT DOCUMENTS

| | | | |
|---|---|---|---|
| 6,334,405 B1 * | 1/2002 | Takahara | H01J 37/32055 118/723 VE |
| 2004/0112736 A1 | 6/2004 | Larrinaga | |
| 2006/0237309 A1 | 10/2006 | Goikoetxea Larrrinaga | |
| 2008/0110749 A1 | 5/2008 | Krassnitzer et al. | |
| 2009/0139853 A1 | 6/2009 | Yamamoto et al. | |
| 2012/0037493 A1 | 2/2012 | Tanifuji et al. | |

FOREIGN PATENT DOCUMENTS

| | | |
|---|---|---|
| EP | 1 020 541 A3 | 7/2000 |
| JP | 2 232364 | 9/1990 |
| JP | 4 236770 | 8/1992 |
| JP | 8 199346 | 8/1996 |
| JP | 9 25573 | 1/1997 |
| JP | 11 269634 | 10/1999 |
| JP | 2003-342717 | 12/2003 |
| JP | 2004 523658 | 8/2004 |
| JP | 2009-144236 | 7/2009 |
| JP | 2010 275625 | 12/2010 |
| WO | WO 2007/131944 | 11/2007 |
| WO | 2009 066633 | 5/2009 |
| WO | 2010 125756 | 11/2010 |

OTHER PUBLICATIONS

International Search Report dated Apr. 3, 2012 in PCT/JP12/054451 Filed Feb. 23, 2012.

Extended European Search Report dated Feb. 1, 2016 in Patent Application No. 12750142.7.

* cited by examiner

FIG.1
(a)
(b)
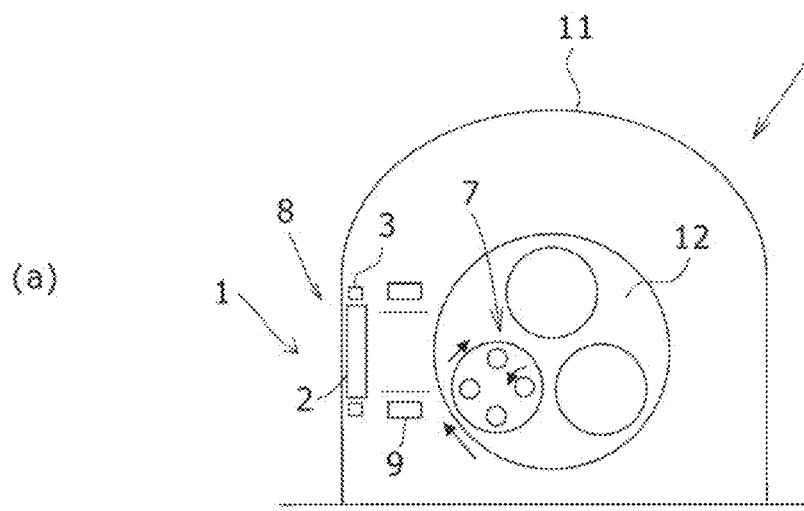
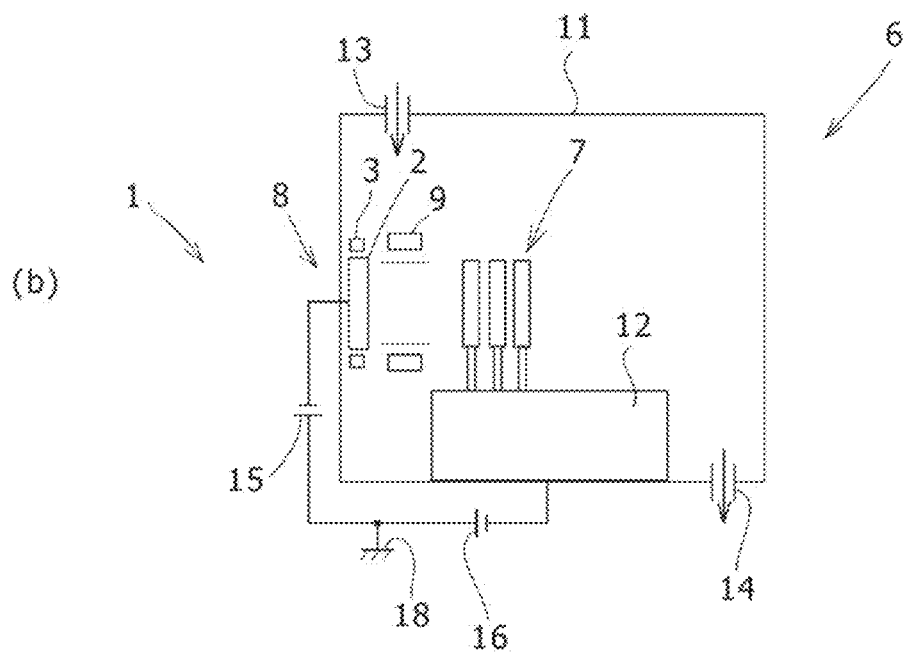

FIG.3
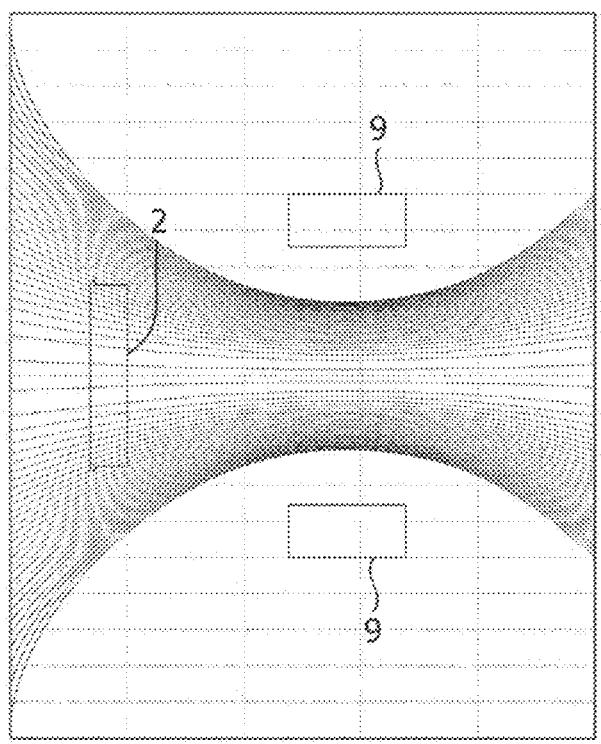
(a)
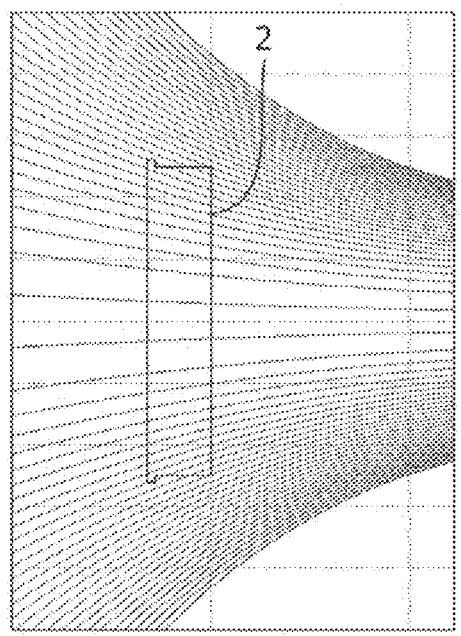
(b)

FIG. 4
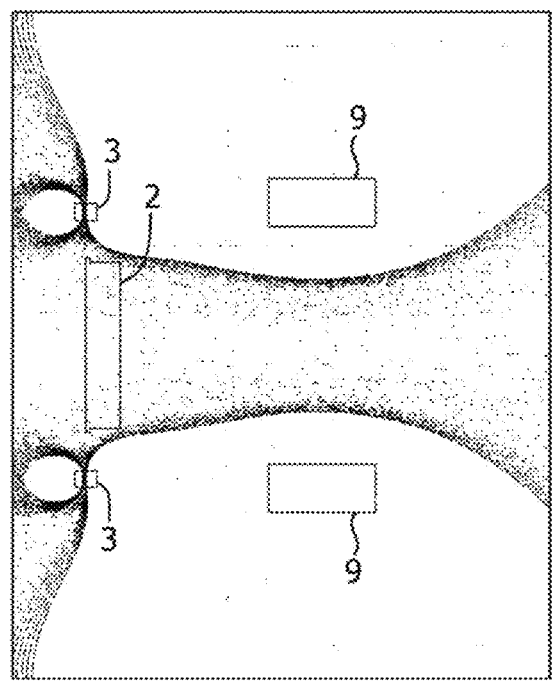
(a)
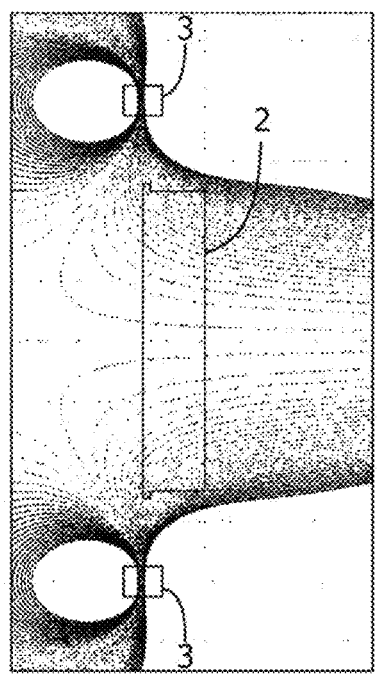
(b)

FIG.6
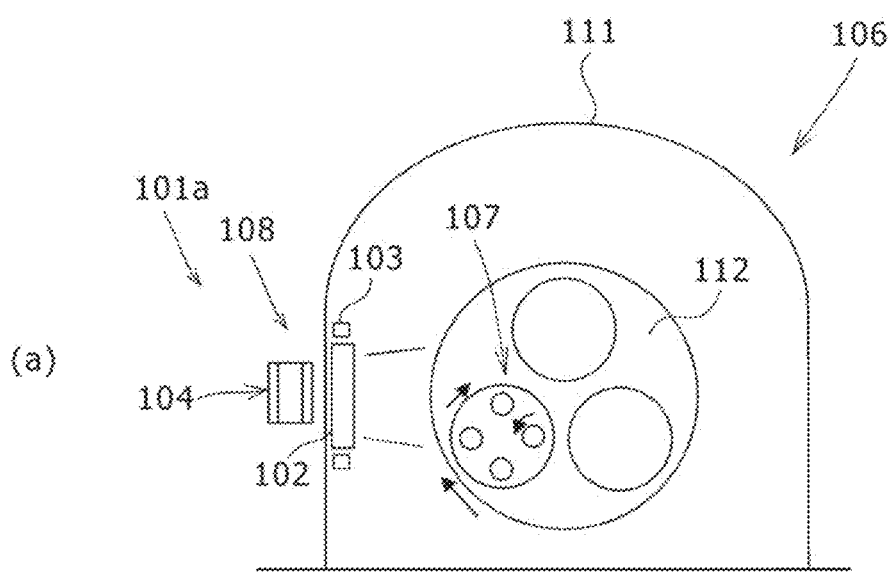
(a)
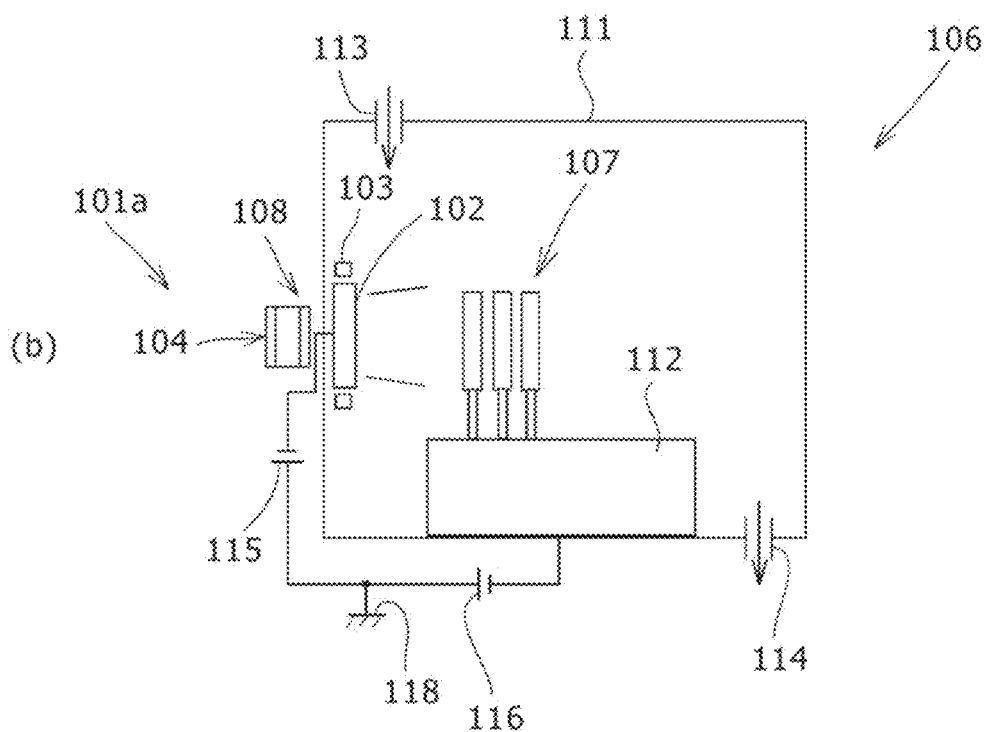
(b)

FIG. 8
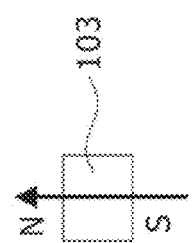
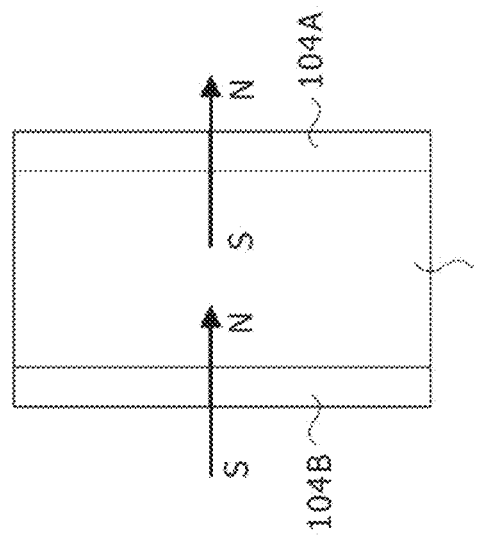

FIG.10
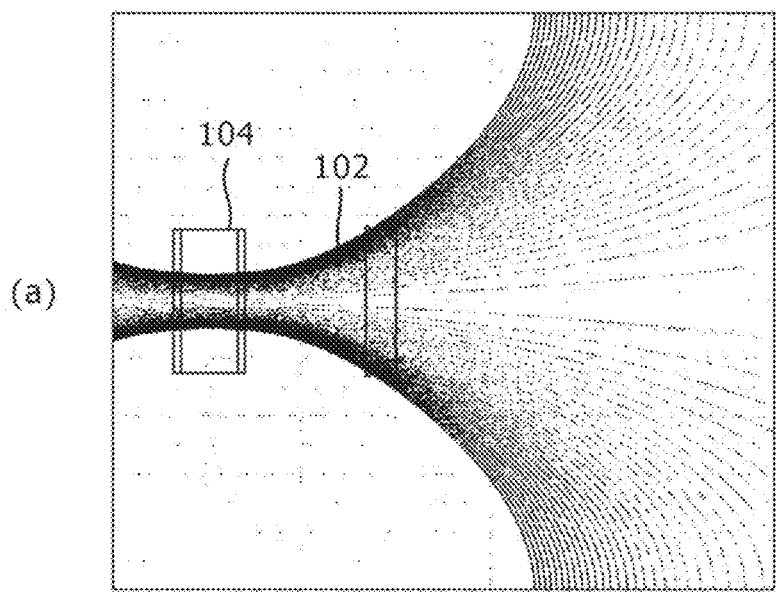
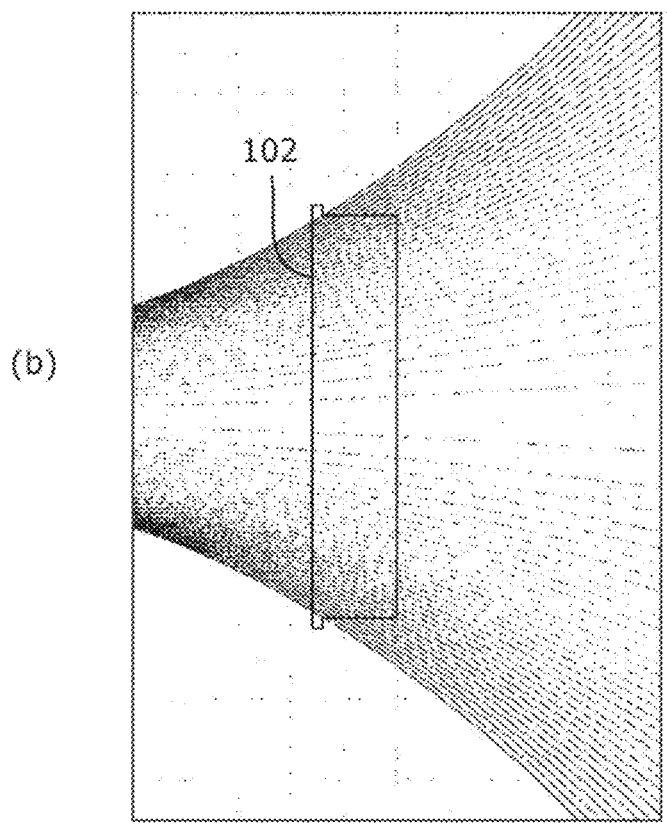

FIG.14
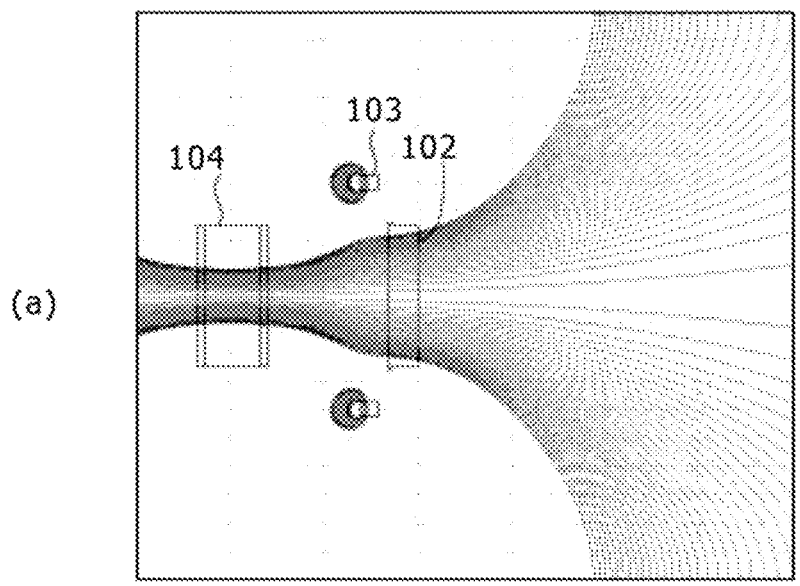
(a)
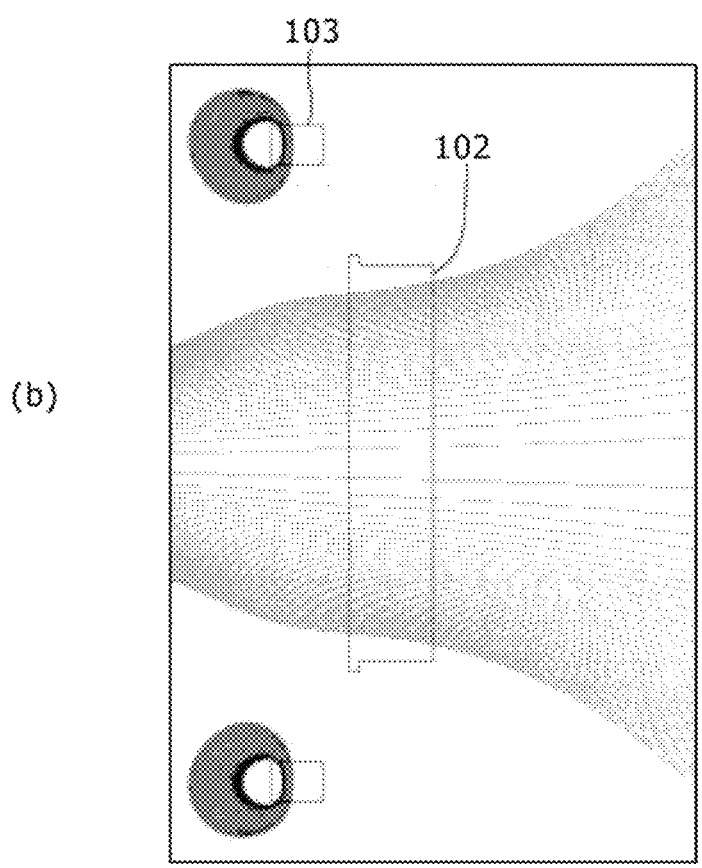
(b)

FIG.16
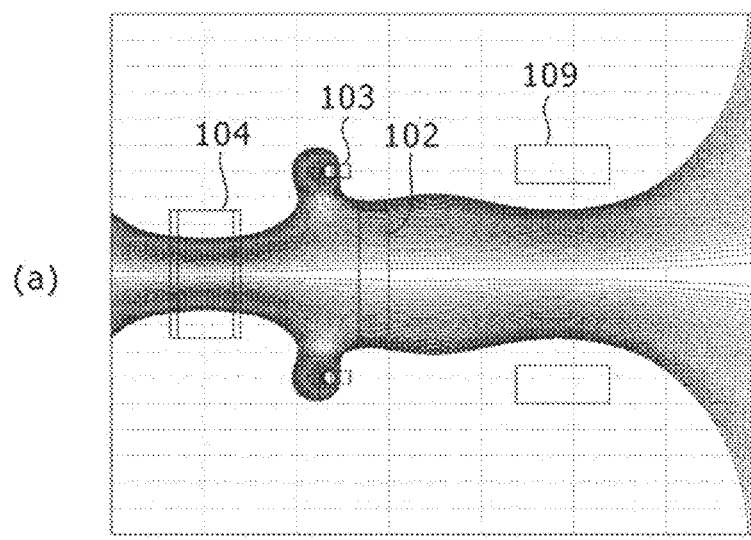
(a)
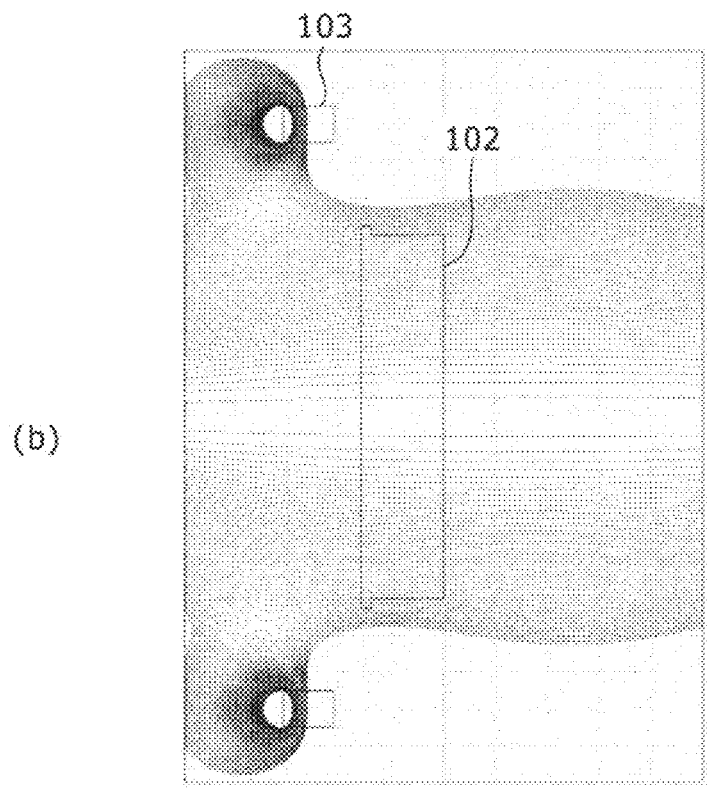
(b)

FIG.17
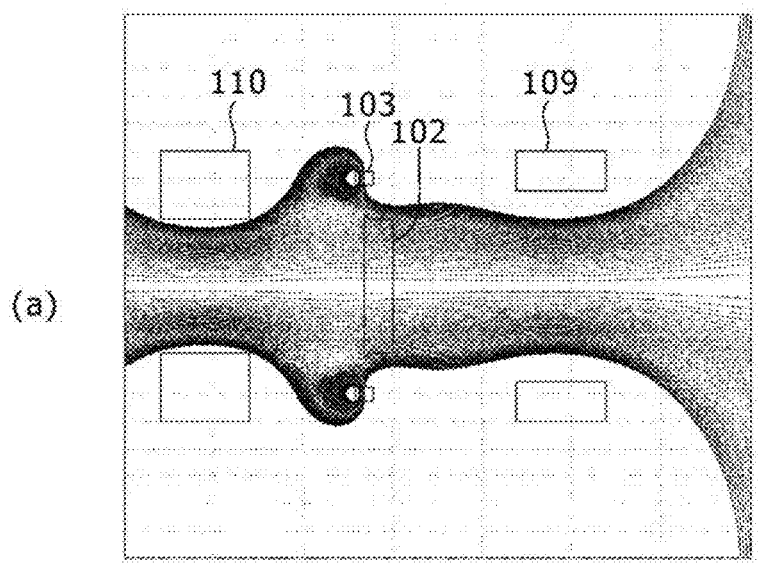
(a)
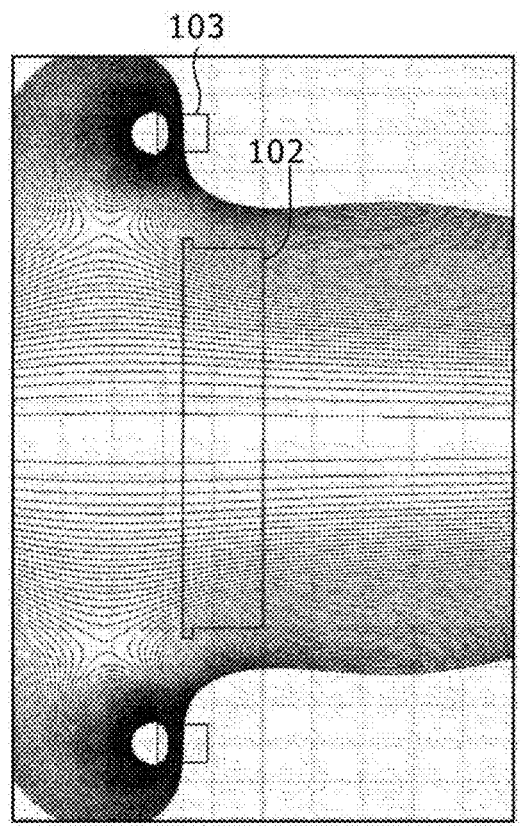
(b)

FIG.18
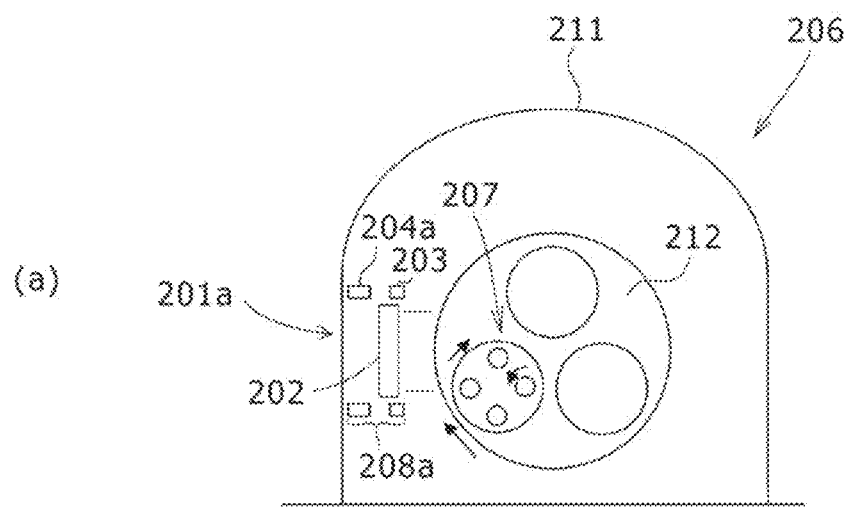
(a)
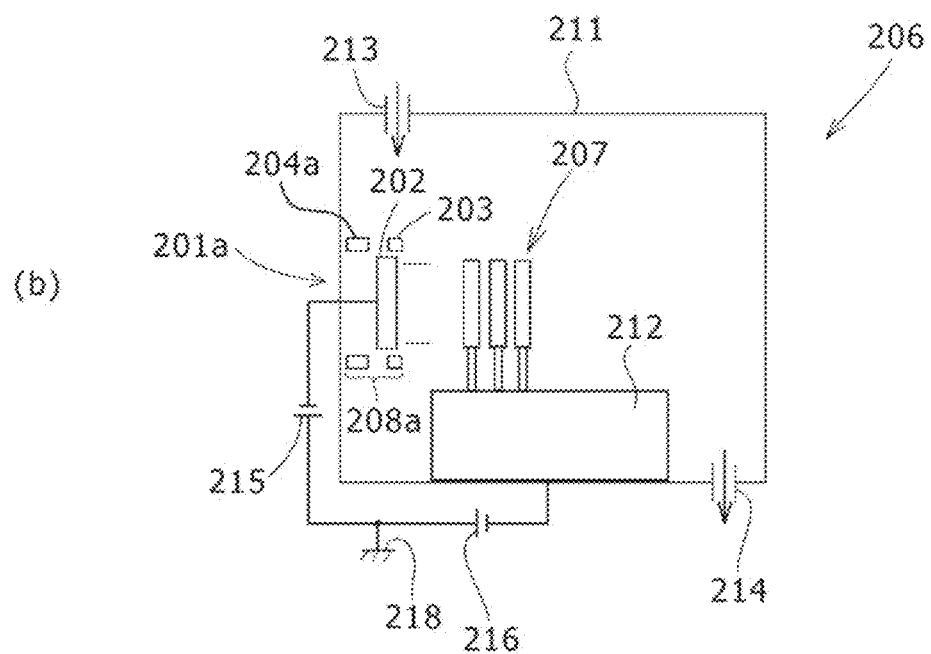
(b)

ARC EVAPORATION SOURCE

TECHNICAL FIELD

The present invention relates to an arc evaporation source used in a film deposition apparatus that forms a thin film such as a ceramic film composed of a nitride or an oxide or an amorphous carbon film for improving abrasion resistance or the like of mechanical components, etc.

BACKGROUND ART

Heretofore, for the purpose of improving abrasion resistance, sliding property, and protective function of mechanical parts, cutting tools, or slidable parts, a physical vapor deposition of coating the surface of substrates of the parts and the tools with a thin film has been used generally. As the physical vapor deposition, arc ion plating or sputtering has been known generally. The arc ion plating is a technique of using a cathodic arc evaporation source.

A cathode discharge arc evaporation source (hereinafter referred to as an arc evaporation source) generates arc discharge on the surface of a target as a cathode, and instantaneously melts and evaporates the material constituting the target. In the arc evaporation source, the material ionized by arc discharge is drawn toward a substrate which is an object to be processed to form a thin film on the surface of the substrate. According to the arc evaporation source, since an evaporation rate of the target is high and an ionization rate of the evaporated material is high, a dense film can be formed by applying a bias to the substrate during film deposition. Therefore, the arc evaporation source has been industrially used for forming an abrasion resistant film on the surface of the cutting tools, etc.

Atoms constituting the target which are evaporated by arc discharge are highly dissociated electrolytically or ionized in arc plasmas. In this case, transportation of ions from the target to the substrate undergoes the effect of a magnetic field between the target and the substrate, and the trajectory thereof is along lines of magnetic force from the target to the substrate.

However, in arc discharge generated between a cathode (target) and an anode, when the target is evaporated around electron emission points (arc spots) on the cathode as the center, a molten target before evaporation (macro-particles) are sometimes emitted from the vicinity of the arc spots. Deposition of the macro-particles to the object to be processed causes deterioration of the surface roughness of the thin film.

In this regard, when the arc spots move at a high speed, the amount of the macro-particles tends to be suppressed. The moving speed of the arc spots undergoes the effect of a magnetic field applied to the surface of the target.

In order to solve such a problem, the following techniques of controlling the movement of the arc spots by application of a magnetic field to the surface of the target have been proposed.

A Patent reference 1 discloses a vacuum arc evaporation source of applying a vertical magnetic field to the surface of the target by providing a ring-shaped magnetic field generating source to the circumference of the target. It is described in the Patent reference 1 that the moving speed of the arc spots is increased and generation of the molten particles can be suppressed by the vacuum arc evaporation source.

A Patent reference 2 discloses an arc evaporation source in which a magnet is disposed at the back of the cathode.

A Patent reference 3 discloses an arc evaporation source comprising an circumferential magnet surrounding the outer circumference of a target and having a direction of magnetization along the direction crossing the surface of the target, and a rear surface magnet having a polarity in the direction identical with that of the circumferential magnet and the direction of magnetization along the direction crossing the surface of the target. It is described in the Patent reference 3 that the straightness of the lines of magnetic force can be improved by the arc evaporation source.

A Patent reference 4 discloses an arc evaporation apparatus forming a magnetic field parallel with the surface of a target by a ring-shaped magnet disposed around the target and a solenoid coil at the back thereof. It is described in the Patent reference 4 that induction of arc in accordance with all of tracks from the center to the outer edge of the target is attained according to the arc evaporation apparatus.

CITATION LIST

Patent Literature

Patent reference 1: Japanese Patent Laid-Open No. H11-269634
Patent reference 2: Japanese Patent Laid-Open No. H08-199346
Patent reference 3: Japanese Patent Laid-Open No. 2010-275625
Patent reference 4: Japanese Patent Laid-Open No. 2004-523658

SUMMARY OF THE INVENTION

Technical Problem

However, in the vacuum arc evaporation source disclosed in the Patent reference 1, since the magnetic field is applied to the surface of the target only from the circumference of the target, the intensity of the magnetic field is decreased in the vicinity of the center of a target surface. When discharge is performed in the vicinity of the center where the intensity of the magnetic field is decreased, a great amount of macro-particles are released.

It is difficult to apply the technique in which the magnetic field is decreased in the vicinity of the center to an evaporation source of using a large size target. Further, since the lines of magnetic force from the surface of the target do not extend in the direction to the substrate, the material of the target which is ionized by evaporation cannot be induced efficiently to the substrate. In order to avoid the problem, it may be considered to increase the value of a current added to a ring-shaped magnetic field generating source. However, the configuration of relying only on the increase of the current is limited in view of the problem such as generation of heat, etc.

Further, since the lines of magnetic force from the surface of the target are directed in the direction deviating from the axis, a great amount of lines of magnetic force deviating from the substrate are generated. In the configuration of the magnetic field where such lines of magnetic field are formed, since ions evaporated from the target are not transported efficiently to the substrate, the film deposition rate is lowered.

Further, according to the arc evaporation source disclosed in the Patent reference 2, while a strong magnetic field can be applied to the surface of the cathode by the magnet at the back of the cathode, lines of magnetic force extend (diverge)

in the direction from the center to the outer circumference (outer side) at the surface of the cathode. In a state where a vertical magnetic field is applied to the surface of the cathode, arc spots tend to move in the direction in which the lines of magnetic forces are turned down. Accordingly, the arc spots move to the outer circumference during discharge to cause instable discharge and, concurrently, local discharge occurs only at the outer circumference. Further, since the lines of magnetic force from the target do not extend in the direction to the substrate, ionized target material cannot be induced efficiently in the direction to the substrate.

In the arc evaporation source disclosed in the Patent reference 3, lines of magnetic force are generated in the direction from the surface of the target to the substrate by two disk-shaped magnets disposed being spaced from each other at the back of the target, the two disk magnets can generate lines of magnetic force at high straightness in a central region. However, lines of magnetic force emitting from the outer circumference relative to the central region diverge outwardly relative to the axis of the disk magnets. Since this is an inevitable phenomenon as general characteristics of magnets, there is still a room for improvement in inducing the ionized target material efficiently to the substrate.

Further, according to the arc evaporation apparatus disclosed in the Patent reference 4, lines of magnetic force at high straightness are generated from the central region of the solenoid coil, but lines of magnetic force emitting from the outer circumference relative to the central region of the solenoid coil diverge outwardly relative to the axis of the solenoid coil.

That is, in the techniques disclosed in the Patent references 3 and 4, lines of magnetic force of high straightness can be generated only at the central region of the target from the front of the target to the substrate in view of the characteristics of permanent magnets or electromagnets disposed at the back of the target. Accordingly, the film deposition rate cannot be improved sufficiently even by the techniques disclosed in the Patent references 3 and 4.

In view of the problems described above, the present invention intends to provide an arc evaporation source capable of controlling lines of magnetic force such that the slope of the lines of magnetic force at the front of the target is vertical, or the slope of the lines of magnetic force at the front of the target is in a direction from the outer circumference to the center (inside) at the front of the cathode.

Solution to Problem

For attaining the foregoing object, the arc evaporation source according to the present invention includes
at least one of a ring-shaped circumferential magnet disposed to the outer circumference of a target and a rear surface magnet disposed at the back of the target in which
one of the circumferential magnet and the rear surface magnet is disposed so as to have a polarity where the direction of magnetization is parallel with the front surface of the target, by which the direction of lines of magnetic force passing the evaporation surface of the target becomes substantially vertical to the evaporation surface.

Particularly, the arc evaporation source according to the first invention of the present invention includes
a ring-shaped circumferential magnet and
a ring-shaped magnetic field generating mechanism, in which
the direction of magnetization of the circumferential magnet is along the radial direction,
the circumferential magnet is disposed surrounding the outer circumference of the target such that the direction of magnetization of the circumferential magnet is along the direction parallel with the front surface of the target, and
the magnetic field generating mechanism is disposed ahead of the target such that the axis of the magnetic field generating mechanism is along a direction substantially vertical to the front surface of the target, thereby generating a magnetic field substantially vertical to the front surface of the target.

Alternatively, an arc evaporation source according to the first invention of the present invention includes
a ring-shaped circumferential magnet and
a ring-shaped magnetic field generating mechanism in which
the direction of magnetization of the circumferential magnet is along the radial direction,
the circumferential magnet is disposed with the front end of the circumferential magnet being situated at the back of the rear surface of the target such that the direction of magnetization of the circumferential magnet is along the direction parallel with the front surface of the target, and
the magnetic field generating mechanism is disposed ahead of the target such that the axis of the magnetic field generating mechanism is along the direction substantially vertical to the front surface of the target, thereby generating a magnetic field in a direction substantially vertical to the front surface of the target.

Further, an arc evaporation source according to a second invention of the present invention includes
a ring-shaped circumferential magnet and
a rear surface magnet in which
the circumferential magnet is disposed surrounding the outer circumference of the target such that the direction of magnetization of the circumferential magnet is along a direction parallel with the front surface of the target,
the rear surface magnet is disposed at the back of the target such that the direction of magnetization of the rear surface magnet is along a direction crossing the front surface of the target, and
a magnetic pole in the radial inside of the circumferential magnet and a magnetic pole of the rear surface magnet on the target side have a polarity identical with each other.

Alternatively, an arc evaporation source according to the second embodiment of the present invention includes
a ring-shaped circumferential magnet,
a rear surface magnet, and
a ring-shaped magnetic field generating mechanism in which
the circumferential magnet is disposed at the back of the rear surface of the target such that the direction of magnetization of the circumferential magnet is along a direction parallel with the front surface of the target,
the rear surface magnet is disposed such that the direction of magnetization of the rear surface magnet crosses the front surface of the target,
a magnetic pole in the radial inside of the circumferential magnet and a magnetic pole of the rear surface magnet on the target side have a polarity identical with each other and
the magnetic field generating mechanism is disposed ahead of the target so as to generate a magnetic field in a direction identical with that of the rear surface magnet and cause the lines of magnetic force that have passed the front surface of the target to pass the radial inside of the magnetic field generating mechanism.

Further, an arc evaporation source according to a third embodiment of the present invention includes a ring-shaped circumferential magnet and a ring-shaped rear surface magnet in which the circumferential magnet is disposed surrounding the outer circumference of the target and has a polarity where the direction of magnetization is along a direction crossing the front surface of the target and directed ahead or behind, the rear surface magnet is disposed at the back of the target, has an inner diameter larger than that of the target, and has a polarity where the direction of magnetization is parallel with the front surface of the target, and the direction of magnetization of the rear surface magnet is directed to the radial inside of the rear surface magnet when the direction of magnetization of the circumferential magnet is directed ahead and the direction of magnetization of the rear surface magnet is directed to a radial outside of the rear surface magnet when the direction of magnetization of the circumferential magnet is directed behind.

Advantageous Effects of Invention

Particularly, according to the first invention among the inventions described above, the lines of magnetic force can be controlled such that a magnetic force between the target and the substrate is increased and the slope of the lines of magnetic force at the target surface is vertical or in the direction from the outer circumference to the center (inside) of the cathode surface.

Particularly, according to the second invention among the inventions described above, the lines of magnetic force can be controlled such that slope of the lines of magnetic force at the target surface is vertical or in the direction from the outer circumference to the center (inside) of the cathode surface.

Particularly, according to the third invention among the inventions described above, the lines of magnetic force of high straightness extending in the direction from the target surface to the substrate can be generated in a wide region at the target surface in the arc evaporation source.

BRIEF DESCRIPTION OF DRAWINGS

FIG. 1(a) is a side elevational view illustrating a schematic constitution of a film deposition apparatus having an arc evaporation source according to a first embodiment of a first invention of the present invention and (b) is a plan view illustrating a schematic constitution of the film deposition apparatus.

FIG. 3 are views illustrating a distribution of lines of magnetic force of an arc evaporation source according to an existent example.

FIG. 4 are views illustrating a distribution of lines of magnetic force of an arc evaporation source according to an exemplary invention of the first invention.

FIG. 6(a) is a side elevational view illustrating a schematic constitution of a film deposition apparatus disposed with an arc evaporation source according to a first embodiment of a second invention of the present invention, and (b) is a plan view illustrating a schematic constitution of the film deposition apparatus.

FIG. 8 is a view illustrating a schematic constitution of an arc evaporation source according to a second embodiment of the second invention.

FIG. 10 are views illustrating a distribution of lines of magnetic force of an arc evaporation source according to an existent example.

FIG. 14 are views illustrating a distribution of lines of magnetic force of an arc evaporation source according to a modified example of the second exemplary invention of the second invention.

FIG. 16 are views illustrating a distribution diagram of lines of magnetic force of an arc evaporation source according to a modified example of the third exemplary invention of the second invention.

FIG. 17 are views illustrating a distribution of lines of magnetic force of an arc evaporation source according to another modified example of the third exemplary invention of the second invention.

FIG. 18(a) is a side elevational view illustrating a schematic constitution of a film deposition apparatus disposed with an arc evaporation source according to a first embodiment of a third invention of the present invention and (b) is a plan view illustrating a schematic constitution of the film deposition apparatus.

DESCRIPTION OF EMBODIMENTS

[First Invention]

Figure 2:
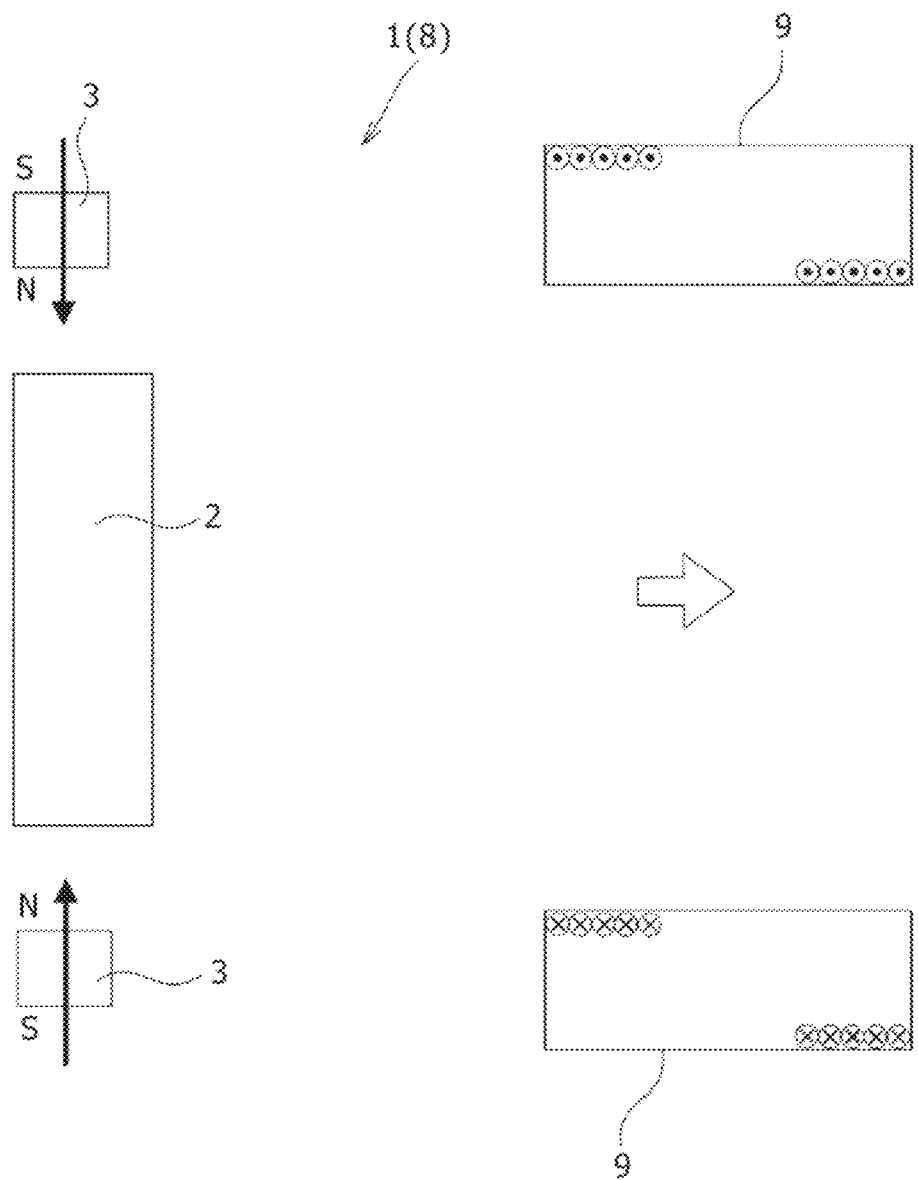
FIG. 2 is a view illustrating a schematic constitution of an arc evaporation source according to the first embodiment the first invention.

A first invention of the present invention is to be described with reference to FIG. 1 to FIG. 5.

First Embodiment (First Invention)

A first embodiment of a first invention is to be described with reference to FIG. 1 and FIG. 2. FIG. 1 illustrate a film deposition apparatus 6 provided with an arc evaporation source 1 (hereinafter referred to as a evaporation source 1) of the first embodiment according to the first invention.

A film deposition apparatus 6 comprises a chamber 11, and a rotary table 12 for supporting a substrate 7 as an object to be processed, and an evaporation source 1 which is attached being opposed to the substrate 7 are disposed in the chamber 1. The chamber 11 has a gas introduction port 13 for introducing a reaction gas into the chamber 11 and a gas exhaust port 14 for exhausting a reaction gas from the inside of the chamber 11.

In addition, the film deposition apparatus 6 comprises an arc power source 15 for applying a negative bias to a target 2 of the evaporation source 1 (to be described later), and a bias power source 16 for applying a negative bias to the substrate 7. Positive electrodes of the arc source 15 and the bias power source 16 are grounded to the ground 18.

As illustrated in FIG. 1, the evaporation source 1 comprises a disk-shaped target 2 having a predetermined thickness which is disposed with the evaporation surface being opposed to the substrate 7 and a magnetic field forming unit 8 disposed near the target 2. The term "disk-shaped" also means a circular cylindrical shape having a predetermined height. The magnetic field forming unit 8 can comprise a circumferential magnet 3. In this embodiment, the chamber 11 acts as an anode. With such a constitution, the evaporation source 1 serves as a cathode discharge arc evaporation source.

The constitution of the evaporation source 1 provided to the film deposition apparatus 6 is to be described below with reference to FIG. 1 and FIG. 2. FIG. 2 is a view illustrating a schematic constitution of the evaporation source 1 according to this embodiment.

As described above, the evaporation source 1 comprises a disk-shaped target 2 having a predetermined thickness and a magnetic field forming unit 8 disposed near the target 2.

In the following description, the surface of the target 2, as an evaporation surface, facing the substrate 7 (in the direction to the substrate indicated by a blank arrow) is referred to as "front surface" and the surface facing the opposite side (direction opposite to the substrate) is referred to as "rear surface" (refer to FIG. 1 and FIG. 2).

The target 2 comprises a material which is selected in accordance with a thin film to be formed on the substrate 7. The material includes ionizable materials such as metal materials, for example, chromium (Cr), titanium (Ti), and titanium aluminum (TiAl) and carbon (C).

The magnetic field forming unit 8 has a solenoid coil 9 as a magnetic field generating mechanism and a ring-shaped (annular or doughnut-shaped) circumferential magnet 3 disposed so as to surround the outer circumference of the target 2. The circumferential magnet 3 comprises a permanent magnet formed of a neodymium magnet having high coercivity.

The solenoid coil 9 is a ring-shaped solenoid that generates a magnetic field in the direction vertical to the front surface (evaporation surface) of the target 2. The solenoid coil 9 has a number of turns, for example, of about several hundred turns (for example, 410 turns) and is wound around so as to form a coil of a diameter somewhat larger than the diameter of the target 2. In this embodiment, the solenoid coil 9 generates a magnetic field by a current of about 2000 A·T to 5000 A·T.

As illustrated in FIG. 2, the solenoid coil 9 is disposed on the front surface side of the target 2, and the projection shadow of the solenoid coil 9 as viewed in the radial direction does not overlap the projection shadow of the target 2. In this case, the solenoid coil 9 is disposed so as to be coaxial with the target 2. When the thus disposed target 2 and the solenoid coil 9 are observed on the side of the substrate 7, a circular target 2 enters substantially coaxially to the inside of a toroidal solenoid coil 9.

When a current is supplied to the thus disposed solenoid coil 9, a magnetic field directing from the target 2 to the substrate 7 is generated in the inside of the solenoid coil 9. The lines of magnetic force passing the front surface of the target 2 can pass the inside of the solenoid coil 9.

The circumferential magnet 3 is a ring body and has a predetermined thickness in the axial direction as described above. The thickness of the circumferential magnet 3 is substantially identical with or somewhat smaller than the thickness of the target 2.

The ring-shaped circumferential magnet 3 comprises, in appearance, two surfaces of toroids (toroidal surfaces) parallel with each other and two circumferential surfaces connecting the two toroidal surfaces in the axial direction. The two circumferential surfaces comprise an inner circumferential surface formed to the inner circumference surface of the toroidal surface and an outer circumferential surface formed to the outer circumference of the toroidal surface. The width for the inner circumferential surface and the outer circumferential surface is a thickness of the circumferential magnet 3.

As illustrated in FIG. 2, the circumferential magnet 3 is magnetized such that the inner circumferential surface forms a N-pole and the outer circumferential surface forms a S-pole. The drawing shows a solid arrow from the S-pole to the N-pole, and the direction of the arrow is hereinafter referred to as a direction of magnetization. The circumferential magnet 3 of this embodiment is disposed such that the direction of magnetization is along the direction parallel with the front surface of the target 2, that is, the direction of magnetization is directed to the target 2.

The circumferential magnet 3 may have a ring-shaped or annular shape integral configuration. Alternatively, the circumferential magnet 3 may also comprise circular cylindrical or cuboidal magnets arranged in a ring-shape or an annular shape so that the direction of magnetization is horizontal to the surface of the target 2.

The circumferential magnet 3 is disposed so as to surround the outer circumference of the target 2 and disposed coaxially with the target 2. The circumferential magnet 3 is disposed so as not to exceed the range of the thickness of the target 2. Thus, projection shadow of the circumferential magnet 3, as viewed in the radial direction, overlaps the projection shadow of the target 2 as viewed in the radial direction. That is, the circumferential magnet 3 is disposed such that when the circumferential magnet 3 and the target 2 are projected in the direction parallel with the evaporation surface of the target 2, respective shadows formed thereby overlap to each other and the shadow of the circumferential magnet 3 is completely contained within the shadow of the target 2.

As described above, the circumferential magnet 3 is disposed to the evaporation source 1 such that the front end of the circumferential magnet 3 as the toroidal surface on the front side is situated at the back of (behind) the front surface of the target 2 and the rear end of the circumferential magnet 3 as the toroidal surface on the rear side is situated in front (ahead) of the rear surface of the target 2.

When the circumferential magnet 3 is disposed as described above, lines of magnetic force near the target 2 can be converged and made to pass the evaporation surface of the target 2 compared with a case of using only the solenoid coil 9. Further, an advantageous effect capable of making the direction of the lines of magnetic force passing the evaporation surface of the target 2 substantially vertical to the evaporation surface is also obtained.

The polarity of the solenoid coil 9 in the constitution described above is such that the N-Pole is on the side of the substrate 7 and the S-pole is on the side of the target 2. Further, the polarity of the circumferential magnet 3 is such that the N-Pole is on the side of the inner circumferential surface opposing the target 2 and the S-pole is on the side of the outer circumferential surface. However, identical distribution of lines of magnetic force can be obtained also in the constitution with the polarity opposed to that described above by reversing the direction of the current supplied to the solenoid coil 9 and using a circumferential magnet having the polarity of the inner circumferential surface and the outer circumferential surface being opposite to that of the circumferential magnet 3.

Then, a method of depositing a film in the film deposition apparatus 6 using the evaporation source 1 is to be described.

At first, after evacuating the chamber 11 by vacuum drawing, an inert gas such as an argon gas (Ar) is introduced from the gas introduction port 13 and impurities such as oxide on the target 2 and the substrate 7 are removed by gas sputtering. After removing the impurities, inside of the chamber 11 is again evacuated and a reaction gas is introduced from the gas introduction port 13 into the evacuated chamber 11.

When arc discharge is generated in this state on the target 2 installed in the chamber 11, materials constituting the target 2 are converted into plasmas and reacted with the reaction gas. Thus, a nitride film, an oxide film, a carbide film, a carbonitride film, an amorphous carbon film, etc. can be formed on the substrate 7 placed on the rotary table 12.

As the reaction gas, a nitrogen gas ($N_2$) or an oxygen gas ($O_2$), or a hydrocarbon gas such as methane ($CH_4$) may be selected according to the application use, and the pressure of the reaction gas in the chamber 11 may be controlled to about 1 to 7 Pa. Further, during film deposition, the target 2 is subjected to discharge by flowing an arc current of 100 to 200 A, and applying a negative voltage at 10 to 30 V from the arc power source 15. Further, a negative voltage at 10 to 200 V may be applied to the substrate 7 by the bias power source 16.

Further, it is preferred to constitute and arrange the circumferential magnet 3 and the solenoid coil 9 such that the magnetic field at the front surface of the target 2 is 100 gauss or more. Thus, film deposition can be performed reliably. The magnetic field on the front surface of the target 2 is more preferably 150 gauss.

The distribution state of the lines of magnetic force when the film deposition is performed by using the evaporation source 1 of this embodiment is to be described specifically by the following embodiments.

Embodiment (First Invention)

With reference to FIG. 3 and FIG. 4, the feature of the distribution of lines of magnetic force generated by the arc evaporation source 1 according to the first embodiment of the first invention is to be described.

Distribution diagrams of lines of magnetic force illustrated in FIG. 3(a) and FIG. 4(a) show distribution of lines of magnetic force from the side of the rear surface of the target 2 to the surface of the substrate 7. In the distribution diagrams of lines of magnetic force in FIG. 3(a) and FIG. 4(a), the right end shows the position for the surface of substrate 7. The distribution diagrams of lines of magnetic force illustrated in FIG. 3(b) and FIG. 4(b) are enlarged views at the circumference of the target 2 in FIG. 3(a) and FIG. 4(a), respectively.

Various experimental conditions in the existent example and examples of the invention to be described below are shown. The target 2 is formed of titanium aluminum (TiAl) at an atomic ratio of titanium (Ti) and aluminum (Al) of 1:1 and the size is (100 mm diameter×16 mm thickness).

The circumferential magnet 3 is formed of a permanent magnet and has a size of (170 mm outer diameter, 150 mm inner diameter, and 10 mm thickness).

Existent Example (First Invention)

For better understanding, distribution of lines of magnetic force in an existent example, that is, in a case of using only the solenoid coil 9 is to be described with reference to FIGS. 3(a) and 3(b).

Referring to FIG. 3(a), lines of magnetic force due to a magnetic field formed by a solenoid coil 9 is introduced from the side of the target 2 under convergence to the inside of the solenoid coil 9 and then directed from the inside of the coil to the surface of the substrate 7 under divergence.

Referring to FIG. 3(b), the lines of magnetic force passing the front surface (evaporation surface) of the target 2 is inclined in the direction from the outer circumference to the inner circumference of the target 2, and converge from the rear surface to the front surface of the target 2.

[Exemplary Invention (First Invention)]

Distributions of lines of magnetic force when the arc evaporation source 1 according to the first embodiment of the first invention is used is to be described with reference to FIGS. 4(a) and 4(b).

With reference to FIG. 4(a), for the lines of magnetic force due to the magnetic field formed by the solenoid coil 9 and the circumferential magnet 2, almost all of the lines of magnetic force directing from the rear surface side of the target 2 to the substrate 7 pass the front surface (evaporation surface) of the target 2 and are introduced into the solenoid coil 9.

When compared with the existent example illustrated in FIG. 3(a), it can be seen that the density of the lines of magnetic force between the target 2 and the solenoid coil 9 is increased. That is, it can be said that the magnetic force between the target 2 and the solenoid coil 9 is increased by the use of the circumferential magnet 2.

Referring to FIG. 4(b), it can be seen that the density of lines of the magnetic force at the front surface (evaporation surface) of the target 2 is increased more compared with the existent example illustrated in FIG. 3(b). In addition, the lines of magnetic force passing the evaporation surface of the target 2 is substantially vertical to the evaporation surface of the target 2 (in other words, substantially parallel with the normal line on the target). However, it can be said that the lines of magnetic force passing the evaporation surface of the target 2 are not only substantially vertical to the evaporation surface but are inclined somewhat in the direction from the outer circumference to the inner circumference of the target 2.

Due to the inclination, a problem that arc spots move to the outer circumference during discharge to make the discharge instable or a problem that local discharge is caused only at the outer circumference is less likely to occur.

As described above, the followings can be understood by the first embodiment and the exemplary invention of the first invention. That is, when the circumferential magnet 3 is disposed, the magnetic force between the target 2 and the solenoid coil 9 can be increased in order to efficiently draw out ionized materials of the target from the evaporation surface of the target 2. When the circumferential magnet 3 is disposed, the intensity of the magnetic force between the target 2 and the solenoid coil 9 can be increased without increasing the value of a current supplied to the solenoid coil 9.

The position for disposing the circumferential magnet 3 is not restricted to the position disclosed in the above-mentioned embodiment.

For example, the circumferential magnet 3 may also be disposed being displaced toward the rear surface side of the target 2. When the position of the circumferential magnet 3 is displaced as described above, the front of the projection shadow as viewed from the radial direction of the circumferential magnet 3 overlaps the back of the projection shadow as viewed from the radial direction of the target 2. That is, the circumferential magnet 3 is disposed such that projection shadow formed when projecting the circumferential magnet 3 and the target 2 in the direction parallel with the evaporation surface of the target 2 are partially overlapped to each other, and the side of the projection shadow of the circumferential magnet 3 overlaps the back side of the projection shadow of the target 2.

In this example, the central position in the direction of the thickness of the circumferential magnet 3 where a solid arrow is situated in FIG. 2, that is, an intermediate position between the front end and the back end of the circumferential magnet is within the range of the width along the direction of the thickness of the target 2, and is disposed ahead (forward) of the rear surface of the target 2.

As described above, the circumferential magnet 3 in this example is disposed to the evaporation source 1 such that the front end of the circumferential magnet 3 is disposed ahead of the rear surface of the target 2. More specifically, it can be said that the circumferential magnet 3 is disposed to the evaporation source 1 such that the front end as the toroidal surface at the front of the target 2 is situated behind (backward) the front surface of the target 2 and/or the rear end as the toroidal surface at the back of the target 2 is disposed in ahead of the rear surface (forward) of the target 2.

As described above, when the circumferential magnet 3 is disposed being displaced to the rear surface side of the target 2, it can be expected that the lines of the magnetic force passing the evaporation surface of the target 2 is more vertical to the evaporation surface of the target 2 (in other words, more parallel with the normal line on the target). In addition, even when the position of the evaporation surface changes due to consumption of the target 2, uniformity of magnetic field at the evaporation surface can be kept in a favorable state.

As described above, the circumferential magnet 3 is preferably disposed such that the front end of the circumferential magnet 3 is situated ahead of the rear surface of the target 2.

Figure 5:
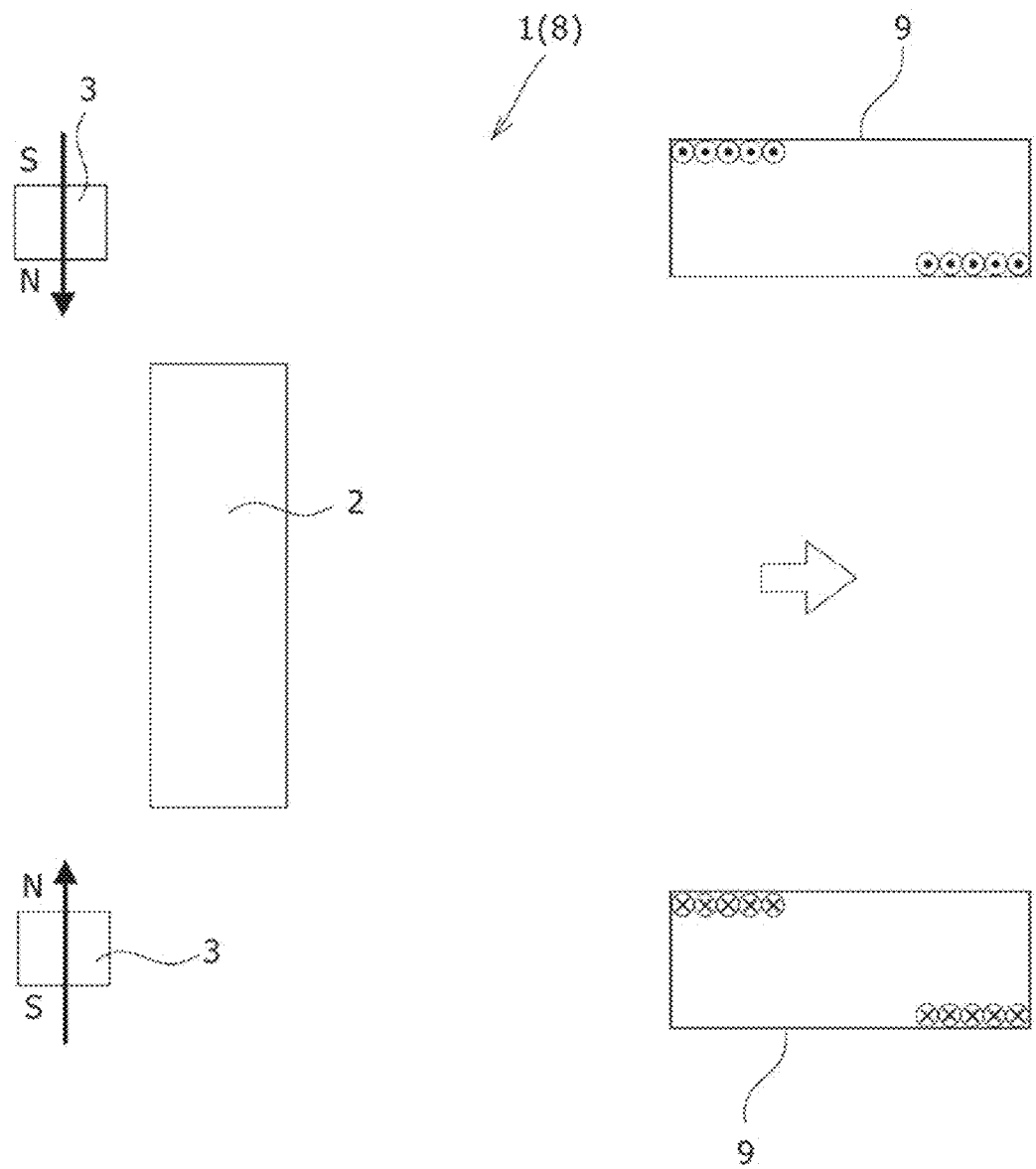
FIG. 5 is a view illustrating a schematic constitution of a modified example of an arc evaporation source according to a preferred embodiment of the first invention.

However, as illustrated in FIG. 5, the circumferential magnet 3 can be sometimes disposed such that the circumferential magnet 3 does not surround the outer circumference of the target 2, that is, the front end of the circumferential magnet 3 is situated at the back of the rear surface of the target 2 as a modified example of the arc evaporation source 1 according to the first embodiment of the first invention. In this example, the front of the projection shadow of the circumferential magnet 3 as viewed in the radial direction is situated behind the back of the projection shadow of the target 2 as viewed in the radial direction. That is, the circumferential magnet 3 can be disposed such that the projection shadows formed when projecting the circumferential magnet 3 and the target 2 in the direction parallel with the evaporation surface of the target 2, do not overlap but the front of the projection shadow of the circumferential magnet 3 is situated at the back of the target 2.

Needless to say, if the circumferential magnet 3 is spaced excessively behind the rear face of the target 2, the magnetic force at the front surface of the target 2 is decreased and lines of magnetic force that diverge to the outside of the target 2 are formed. Then, for example, in a case where predetermined conditions are satisfied, the circumferential magnet 3 may be disposed such that the front end is situated behind the rear surface of the target 2 and the direction of magnetization is along the direction parallel with the front surface of the target 2 at a position where the axis is situated behind the rear surface of the target 2 and the direction of magnetization is along the direction parallel with the front surface of the target 2 at a position where the axis crosses the front surface of the target 2 substantially vertically.

The conditions are, for example, such that the intensity of lines of magnetic force at the front surface of the target 2 is about 100 gauss or more, and lines of magnetic force inclined to the central direction of the target is formed at the outer circumference of the target 2. More preferably, the circumferential magnet 3 is disposed so as to be substantially coaxial with the target 2 (on coaxial axis).

[Second Invention]

A second invention of the present invention is to be described with reference to FIGS. 6 to 17.

First Embodiment (Second Invention)

Figure 7:
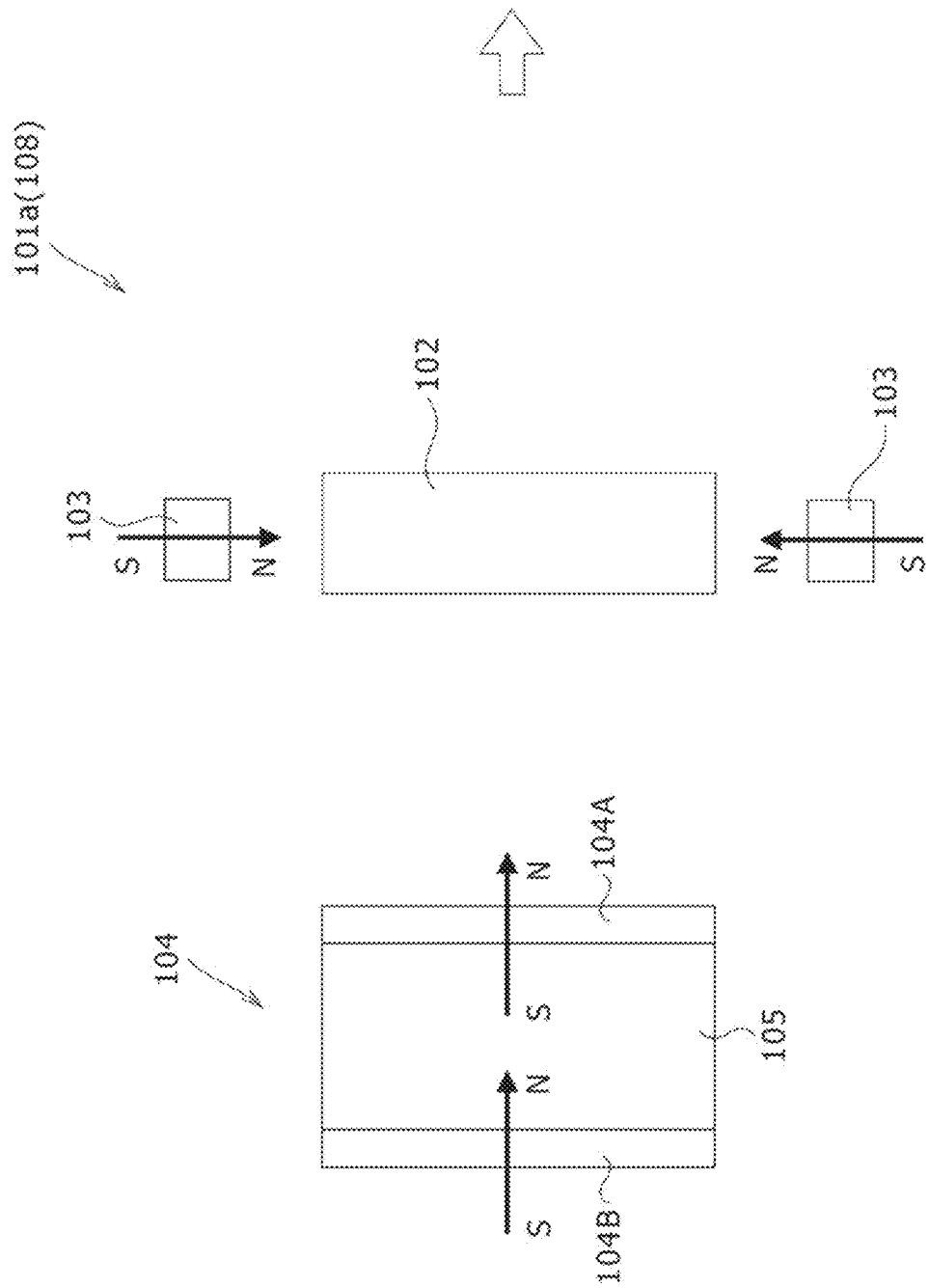
FIG. 7 is a view illustrating a schematic constitution of an arc evaporation source according to the first embodiment of the second invention.

With reference to FIG. 6 and FIG. 7, a first embodiment of the second invention is to be described. FIG. 6 illustrate a film deposition apparatus 106 provided with an arc evaporation source 101a according to the first embodiment of the second invention (hereinafter referred to as an evaporation source 101a).

A film deposition apparatus 106 comprises a chamber 111, and a rotary table 112 for supporting a substrate 107 as an object to be processed and an evaporation source 101a which is attached being opposed to the substrate 107 are disposed in the chamber 111. The chamber 111 has a gas introduction port 113 for introducing a reaction gas into the chamber 111 and a gas exhaust port 114 for exhausting a reaction gas from the inside of the chamber 111.

In addition, the film deposition apparatus 106 comprises an arc power source 115 for applying a negative bias to a target 102 of the evaporation source 101 (to be described later), and a bias power source 116 for applying a negative bias to the substrate 107. Positive electrodes of the arc source 115 and the bias power source 116 are grounded to a ground 118.

As illustrated in FIG. 6, the evaporation source 101a comprises a disk-shaped target 102 having a predetermined thickness and disposed with the evaporation surface being opposed to the substrate 107 and a magnetic field forming unit 108 disposed near the target 102. The term "disk-shaped" also means a circular cylindrical shape having a predetermined height. The magnetic field forming unit 108 comprises a circumferential magnet 103 and a rear surface magnet 104. In this embodiment, the chamber 111 serves as an anode. With such a constitution, the evaporation source 101a serves as a cathode discharge arc evaporation source.

With reference to FIG. 6 and FIG. 7, the constitution of the evaporation source 101a provided to the film deposition apparatus 106 is to be described below. FIG. 7 is a view illustrating a schematic constitution of the evaporation source 101a according to this embodiment.

As described above, the evaporation source 101a comprises a disk-shaped target 102 having a predetermined thickness and a magnetic field forming unit 108 disposed near the target 102.

In the following description, the surface of the target 102, as an evaporation surface, facing the substrate 107 (in the direction to the substrate indicated by a blank arrow) is referred to as "front surface" and the surface thereof facing the opposite side (counter-substrate direction) is referred to as "rear surface" (refer to FIG. 6 and FIG. 7).

The target 102 comprises a material which is selected in accordance with a thin film to be formed on the substrate 107. The material includes ionizable materials such as metal materials, for example, chromium (Cr), titanium (Ti), and titanium aluminum (TiAl) and carbon (C).

The magnetic field forming unit 108 has a ring-shaped (annular or doughnut-shaped) circumferential magnet 103 disposed so as to surround the outer circumference of the target 102 and a rear surface magnet 104 disposed at the back of the rear surface of the target 102. The circumferential magnet 103 and the rear surface magnet 104 comprise a permanent magnet formed of a neodymium magnet having high coercivity.

The circumferential magnet 103 is a ring body and has a predetermined thickness in the axial direction as described above. The thickness of the circumferential magnet 103 is substantially equal with or somewhat smaller than the thickness of the target 102.

The ring-shaped circumferential magnet 103 comprises, in appearance, two surfaces of toroids parallel with each other (toroidal surfaces) and two circumferential surfaces that connect the two toroidal surfaces in the axial direction. The two circumferential surfaces comprise an inner circumferential surface formed to the inner circumference of the toroidal surface and an outer circumferential surface formed to the outer circumference of the toroidal surface. The width for the inner circumferential surface and the outer circumferential surface is a thickness of the circumferential magnet 103.

As illustrated in FIG. 7, the circumferential magnet 103 is magnetized such that the inner circumferential surface forms a N-pole and the outer circumferential surface forms a S-pole. The drawing shows a solid (black) arrow from the S-pole to the N-pole and the direction of the arrow is hereinafter referred to as direction of magnetization. The circumferential magnet 103 of this embodiment is disposed such that the direction of magnetization is along the direction parallel with the front surface of the target 102, that is, such that the direction of magnetization is directed to the target 102.

The circumferential magnet 103 may also has an integrated ring-shaped or annular shaped configuration. Alternatively, the circumferential magnet 103 may also comprise circular cylindrical or cuboidal magnets arranged in a ring-shape or an annular shape so that the direction of magnetization is horizontal to the surface of the target 102.

The circumferential magnet 103 is disposed so as to surround the outer circumference of the target 102 and is disposed coaxially with the target 102. The circumferential magnet 103 is disposed so as not to exceed the range of the thickness of the target 102. Thus, a projection shadow of the circumferential magnet 103 as viewed in the radial direction overlaps a projection shadow as viewed in the radial direction of the target 102. That is, the circumferential magnet 103 is disposed such that when the circumferential magnet 103 and the target 102 are projected in the direction parallel with the evaporation surface of the target 102, respective projection shadows formed by projection overlap to each other and the projection shadow of the circumferential magnet 103 is completely included within the shadow of the target 102.

Thus, the circumferential magnet 103 is disposed to the evaporation source 101a such that the front end of the circumferential magnet 103 which is the toroidal surface on front of the circumferential magnet 103 is situated at the back (behind) of the front surface of the target 102 and the rear end of the circumferential magnet 103 which is the toroidal surface of the front of the circumferential magnet 103 is situated ahead (forward) of the rear surface of the target 102.

Further, the circumferential magnet 103 is disposed such that an intermediate position between the front end and the rear end is aligned with an intermediate position between the front surface and the rear surface of the target 102.

The rear surface magnet 104 comprises a non-ring shaped magnetic core 105 and two disk-shaped rear surface magnets 104A and 104B sandwiching the magnet core 105. The disk-shaped rear surface magnets 104A and 104B are also non-ring shaped likewise the magnetic core 105. The term "non-ring shaped" means not an annular shape of a doughnut-like shape in which an aperture is formed in the radial inside but means a solid shape such as a disk-like shape or a circular cylinder shape. That is, "non-ring shape" means such a shape that normal lines directing from the surface to the outward do not intersect each other. In view of the knowledge so far, it has been found that the thickness of the magnet at the rear surface side should be increased in order to efficiently extend the lines of magnetic force to the substrate. For this purpose, in this embodiment, two magnets, that is, disk-shaped rear surface magnets 104A and 104B are disposed being spaced apart from each other for increasing the thickness, and the space therebetween is filled with the magnetic core 105 as a magnetic body to prevent lowering of the magnetic force.

As illustrated in FIG. 7, the disk-shaped rear surface magnets 104A and 104B are each magnetized such that one of disk surfaces forms a N-pole and the other of the disk surfaces forms a S-pole. The disk-shaped rear surface magnets 104A and 104B sandwich the magnetic core 105 between the surface on the side of the S-pole of the disk-shaped rear surface magnet 104A and the surface on the side of the N-pole of the disk-shaped rear surface magnet 104B to direct the magnetization direction to an identical direction.

The thus constituted rear surface magnet 104 is disposed to the side of the rear surface of the target 102 such that the direction of magnetization is along the axis of the target 102, and the direction of magnetization is vertical to the evaporation surface of the target 102. Further, the rear surface magnet 104 is disposed such that the N-pole side of the disk-shaped rear surface magnet 104A is directed to the target 102. The rear surface magnet 104 is disposed such that the axis thereof is substantially aligned with the axis of the target 102.

The evaporation source 101a is constituted by disposing the circumferential magnet 103 and the rear surface magnet 104 to the target 102 as described above. In this embodiment, the direction of magnetization in the circumferential magnet 103 is directed to the direction parallel with the front surface of the target 102, that is, directed to the target 102. Further, since the magnetic pole on the inner circumference of the circumferential magnet 103 is a N-pole and the magnetic pole of the of the rear surface magnet 104 facing the target 102 is also the N-pole, the magnetic pole in the radial inside of the circumferential magnet 103 and the magnetic pole of the rear surface magnet 104 facing the target 102 have an identical polarity.

As described above, since the circumferential magnet 103 and the rear surface magnet 104 face the target 102 at the identical polarity, the magnetic field formed by the circumferential magnet 103 and the magnetic field formed by the rear surface magnet 104 can be combined. This can provide an effect capable of making the direction of the lines of magnetic force that pass the evaporation surface of the target 102 substantially vertical to the evaporation surface, and introducing the lines of magnetic force in the direction of the substrate 107.

As described above, since the circumferential magnet and the rear surface magnet 104 may face the target 102 each at an identical magnetic pole, the evaporation source 101a may also be constituted such that the circumferential magnet 103 and the rear surface magnet 104 face the target 102 each at the S-pole.

Then, a film deposition method in the film deposition apparatus 106 using the evaporation source 101a is to be described.

At first, after evacuating the chamber 111 by vacuum drawing, an inert gas such as an argon gas (Ar) is introduced from the gas introduction port 113 and impurities such as oxides on the target 102 and the substrate 107 are removed by gas sputtering. After removing the impurities, inside of the chamber 111 is again evacuated and a reaction gas is introduced from the gas introduction port 113 into the evacuated chamber 111.

When arc discharge is generated on the target 102 installed in the chamber 111 in this state, materials constituting the target 102 are converted into plasmas and are reacted with the reaction gas. Thus, a nitride film, an oxide film, a carbide film, a carbonitride film, an amorphous carbon film, etc. can be formed over the substrate 107 which is placed on the rotary table 112.

As the reaction gas, a nitrogen gas ($N_2$) or an oxygen gas ($O_2$), or a hydrocarbon gas such as methane ($CH_4$) may be selected according to the application use and the pressure of the reaction gas in the chamber 111 may be at about 1 to 7 Pa. Further, during film deposition, the target 102 is subjected to discharge by flowing an arc current of 100 to 200 A and applying a negative voltage at 10 to 30 V from the arc power source 115. Further, a negative voltage of 10 to 200 V may be applied to the substrate 107 by the bias power source 116.

Further, it is preferred to constitute and arrange the circumferential magnet 103 and the rear surface magnet 104 such that the magnetic field on the front surface of the target 102 is 100 gauss or more. Thus, films can be deposited reliably. The magnetic field on the front surface of the target 102 is more preferably 150 gauss.

The distribution state of the lines of magnetic force when film deposition is performed by using the evaporation source 101a of this embodiment is to be described specifically by the following examples.

Second Embodiment (Second Invention)

Then, a second embodiment of the second invention is to be described with reference to FIG. 8.

FIG. 8 is a view illustrating a schematic constitution of an arc evaporation source 101b used in a film deposition apparatus 106 according to this embodiment.

An arc evaporation source 101b in this embodiment comprises a disk-shaped target 102 having a predetermined thickness and a magnetic field forming unit 108 disposed near the target 102 in the same manner as the arc evaporation source 101a in the first embodiment of the second invention. The magnetic field forming unit 108 has a ring-shaped (annular) circumferential magnet 103 disposed so as to surround the outer circumference of the target 102, and a rear surface magnet 104 disposed at the rear surface side of the target 102.

As described above, the evaporation source 101b in this embodiment has the same constitution as that in the arc evaporation source 101a in the first embodiment of the first invention but it is different only for the arrangement of the circumferential magnet 103.

Arrangement of the circumferential magnet 103 of the evaporation source 101b in this embodiment is to be described below.

Referring to FIG. 8, when taking notice on the position of the circumferential magnet 103 relative to the target 102, it can be seen that the circumferential magnet 103 is disposed to the target 102 being displaced to the side of the rear surface magnet 104 (rear surface side). When the position of the circumferential magnet 103 is displaced as described above, the front of a projection shadow as viewed in the radial direction of the circumferential magnet 103 overlaps the back of the projection shadow of the target 102 as viewed in the radial direction. That is, the circumferential magnet 103 is disposed such that when the circumferential magnet 103 and the target 102 are projected in the direction parallel with the evaporation surface of the target 102, respective projection shadows formed by projection partially overlap to each other and such that the front side of the projection shadow of the circumferential magnet 103 overlaps the back of the projection shadow of the target 102.

In this case, a central position in the direction of the thickness of the circumferential magnet 103 shown by solid arrows for the circumferential magnet 103 in FIG. 8, that is, an intermediate position between the front end and the rear end of the circumferential magnet 103 is disposed ahead (forward) of the rear surface of the target 102 within a range of the width along the direction of the thickness of the target 102.

That is, the circumferential magnet 103 in this embodiment is disposed to the evaporation source 101b such that the front end is disposed ahead of the rear surface of the target 102 and the rear end is disposed behind the rear surface of the target 102. Referring more specifically, the circumferential magnet 103 in this embodiment is provided to the evaporation source 101b with the intermediate position between the front end and the rear end being behind (backward) an intermediate position between the front surface and the rear surface of the target 102.

As described above, when the circumferential magnet 103 is disposed to the target 102 being displaced to the rear surface magnet 104, an effect capable of favorably keeping the uniformity of the magnetic field at the evaporation surface can be obtained even when the position of the evaporation source is changed due to consumption of the target 102, in addition to the effect of the first embodiment.

Since the second embodiment of the second invention is substantially identical with the first embodiment except for the disposition of the circumferential magnet 103 shown above, explanation therefor is to be omitted.

The state of a distribution of lines of magnetic force when a film is deposited by using the evaporation source 101b of the second embodiment of the second invention is to be described specifically with reference to examples to be described later.

Third Embodiment (Second Invention)

Figure 9:
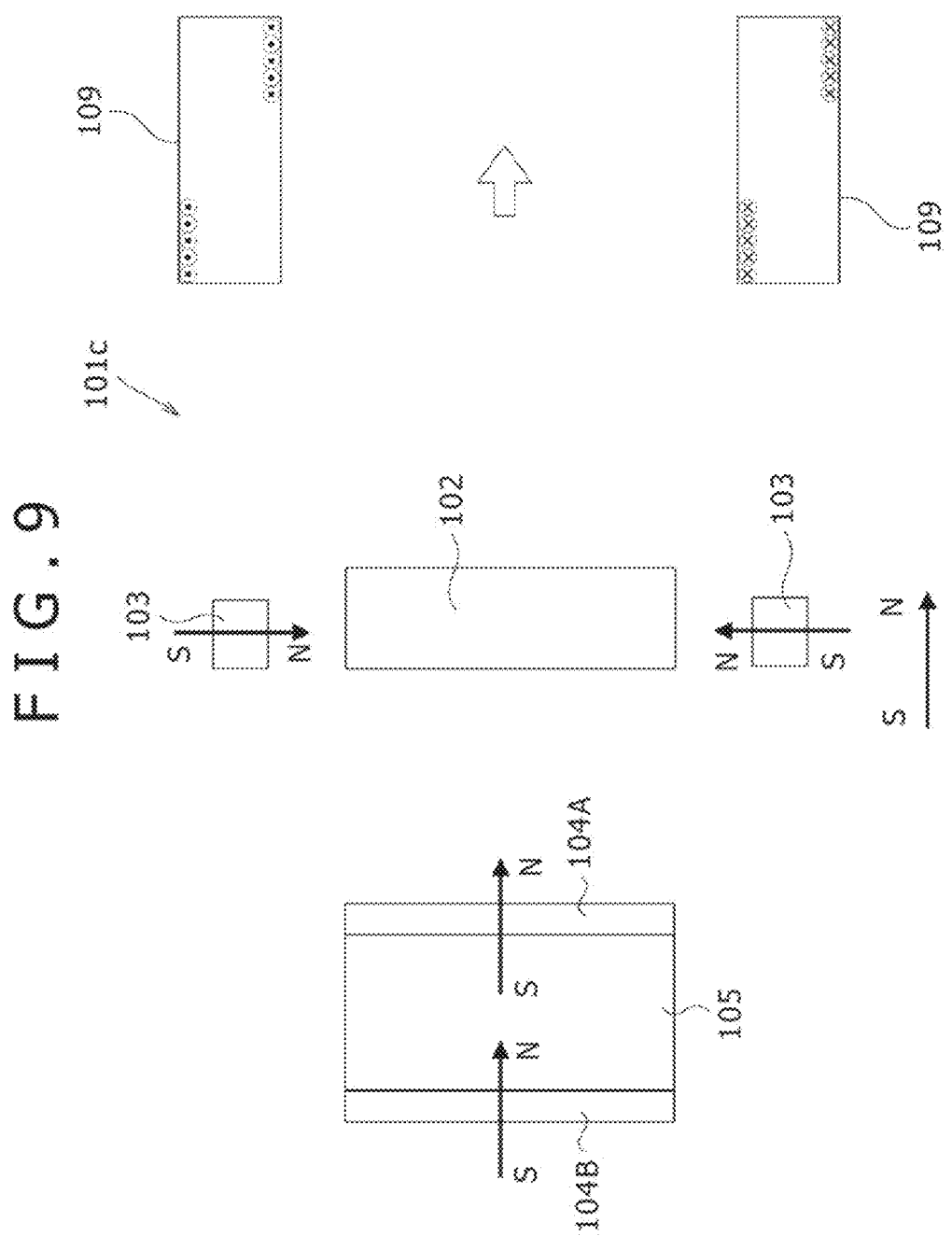
FIG. 9 is a view illustrating a schematic constitution of an arc evaporation source according to a third embodiment of the second invention.
Figure 11:
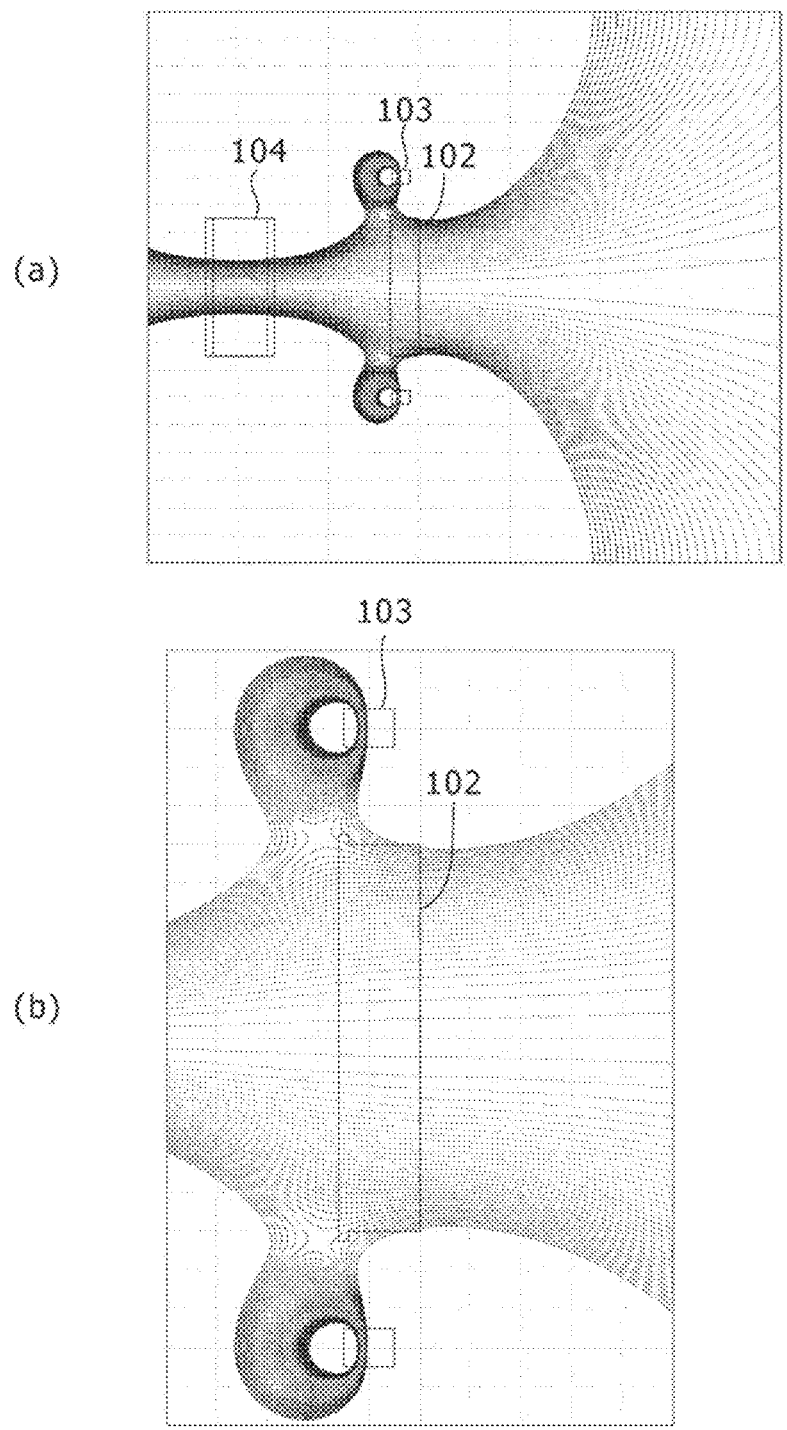
FIG. 11 are views illustrating a distribution of lines of magnetic force of an arc evaporation source according to a first exemplary invention of a second invention.
Figure 12:
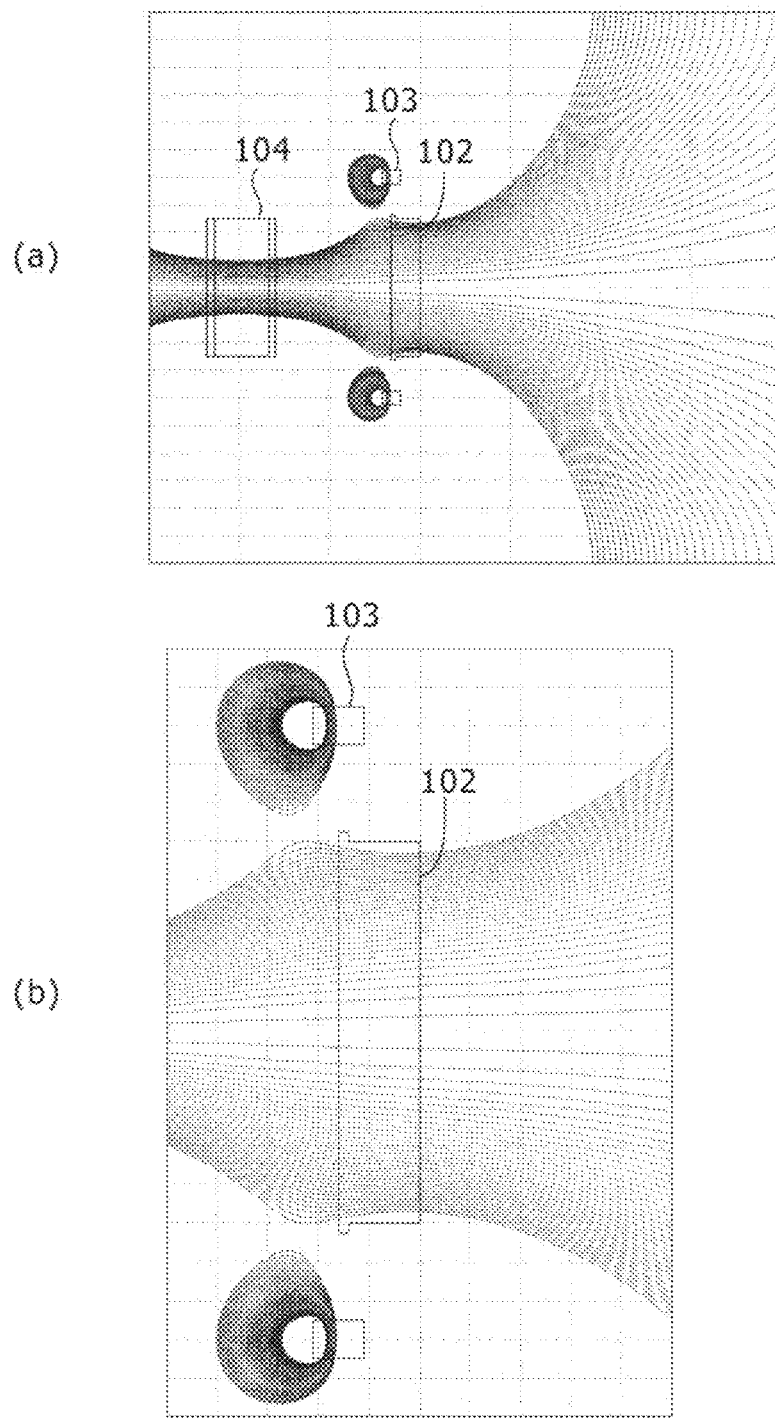
FIG. 12 are views illustrating a distribution of lines of magnetic force of an arc evaporation source according to a second exemplary invention of the second invention.
Figure 13:
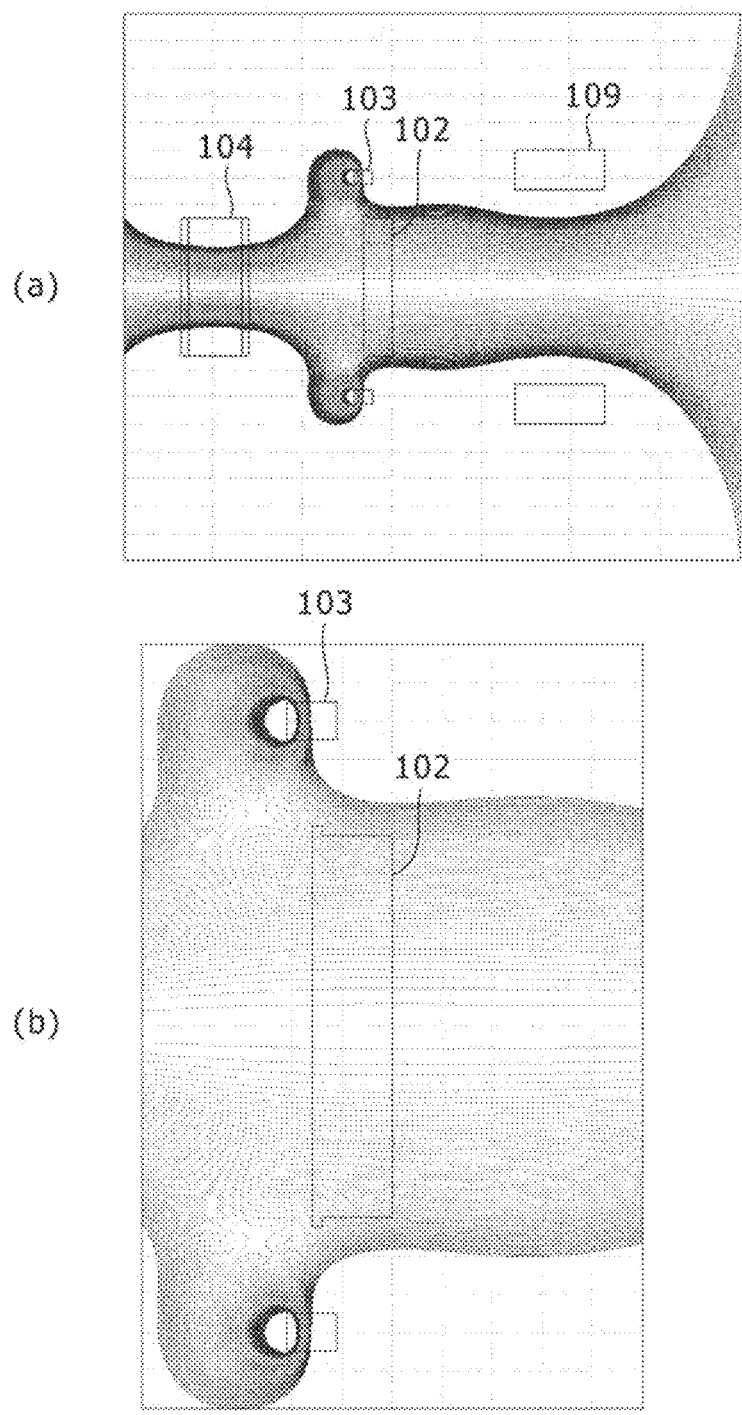
FIG. 13 are views illustrating a distribution of lines of magnetic force of an arc evaporation source according to a third exemplary invention of the second invention.
Figure 15:
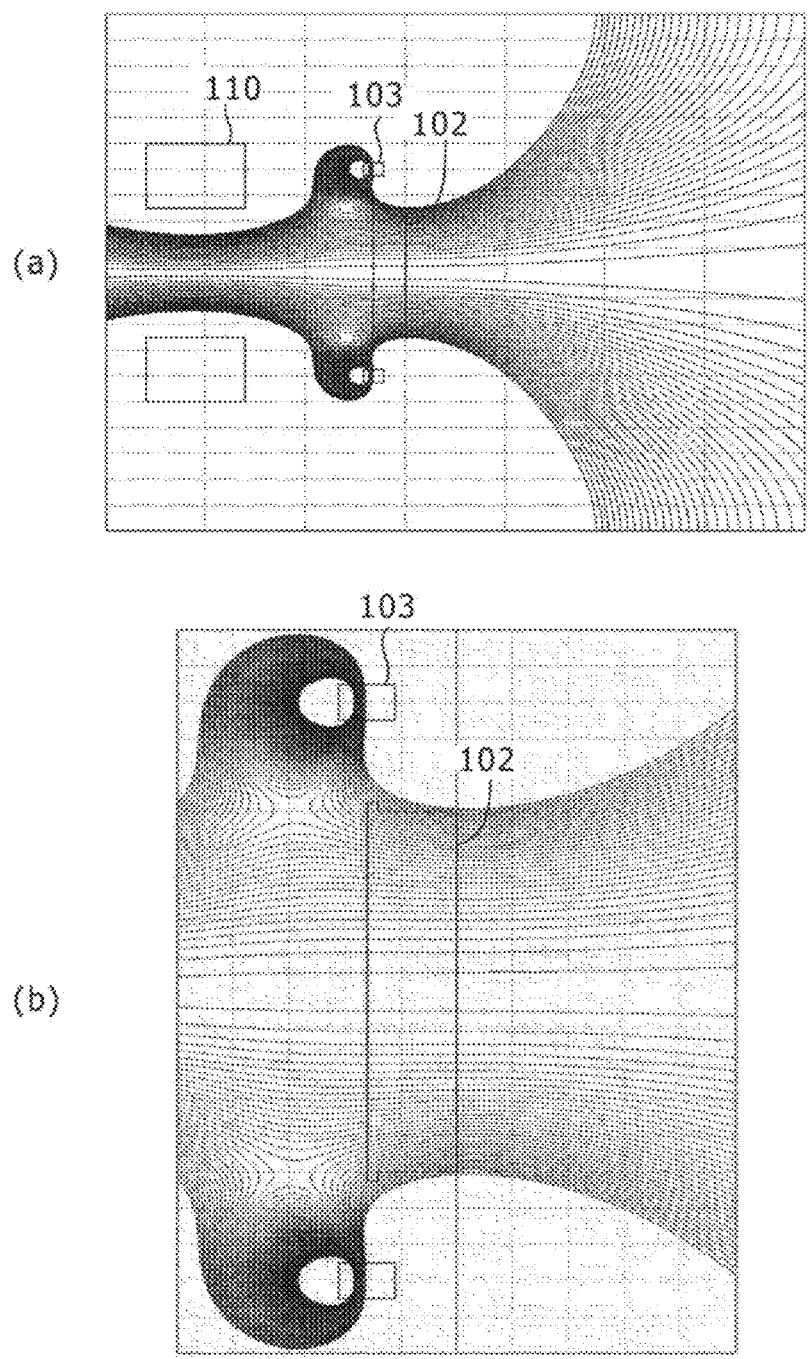
FIG. 15 are views illustrating a distribution of lines of magnetic force of an arc evaporation source according to another modified example of the second exemplary invention of the second invention.

A third embodiment of the second invention is to be described referring to FIG. 9.

FIG. 9 is a view illustrating a schematic constitution of an arc evaporation source 101c used in a film deposition apparatus 106 according to this embodiment.

The arc evaporation source 101c in this embodiment is different from the arc evaporation source 101a in the first embodiment of the second invention in that it has a solenoid coil 109 as a magnetic field generating mechanism.

Other constitutions, for example, a disk-shaped target 102 having a predetermined thickness, a ring-shaped circumferential magnet 103 disposed so as to surround the outer circumference of the target 102, a rear surface magnet 104 disposed at the back of the target 102, etc. are substantially identical with those in the first embodiment.

Therefore, constitution and arrangement of the solenoid coil 109 of the evaporation source 101c are to be described.

The solenoid coil 109 is a ring-shaped solenoid that generates a magnetic field in the direction identical with that of the rear surface magnet 104. The solenoid coil 109 has a number of turns, for example, about several hundreds of turns (for example, 410 turns) and is wound around so as to form a coil of a diameter somewhat larger than the diameter of the target 102. In this embodiment, the solenoid coil 109 generates a magnetic field by a current of about 2000 A·T to 5000 A·T.

As illustrated in FIG. 9, the solenoid coil 109 is disposed in front of the target 102 and a projection shadow of the solenoid coil 109 as viewed in the radial direction does not overlap the projection shadow of the target 102. In this case, the solenoid coil 109 is disposed so as to be coaxial with the target 102. When the thus arranged target 102 and the solenoid coil 109 are viewed from the rear surface magnet 104 and the substrate 107, the circular target 102 enters substantially coaxially to the inside of the annular solenoid coil 109.

A current is supplied to the thus disposed solenoid coil 109 to generate a magnetic field inside the solenoid coil 109 that flows from the target 102 to the substrate 107. In this embodiment, lines of magnetic force passing the front surface of the target 102 can pass the solenoid coil 109.

When the solenoid coil 109 is disposed as described above, an effect capable of suppressing divergence of lines of magnetic force that have passed the evaporation surface of the target 102 thereby maintaining a high density of lines of magnetic force as far as the surface of the substrate 107 can also be obtained in addition to the effect of the first embodiment. Further, when the solenoid coil 109 is disposed between the target 102 and the substrate 107, an effect capable of improving the ion transporting efficiency from the target 102 to the substrate 107 can also be expected.

The state of distribution of lines of magnetic force in a case of depositing films by using the evaporation source 101c of the third embodiment is to be described specifically by way of the examples to be described below.

Example

Since the arc evaporation sources 101a to 101c of the first embodiment to the third embodiment of the second invention are different respectively for the arrangement of the circumferential magnet 103, presence or absence of the solenoid coil 109, etc., distributions of generated lines of magnetic force are also different respectively.

With reference to FIG. 10 to FIG. 13, distributions of the lines of the magnetic force generated from the arc evaporation sources 101a to 101c of the first embodiment to the third embodiment are to be described as a first exemplary invention to a third exemplary invention.

The distribution diagrams of lines of magnetic force illustrated in FIG. 10(a), FIG. 11(a), FIG. 12(a), and FIG. 13(a) illustrate distributions of lines of magnetic force from the rear surface magnet 104 to the surface of the substrate 107. In each of the distribution diagrams of the lines of magnetic force in FIG. 10(a) to FIG. 13(a), the right end illustrates a position for the surface of the substrate 107. The distribution diagrams of the lines of magnetic force illustrated in FIG. 10(b), FIG. 11(b), FIG. 12(b), and FIG. 13(b) are enlarged views at the circumference of the target 102 in FIG. 10(a) to FIG. 13(a), respectively.

Various experimental conditions are shown for an existent example and each of exemplary inventions to be described below. For example, the size of the target 102 is (100 mm diameter×16 mm thickness). The size for each of the disk-shaped rear surface magnets 104A and 104B is (100 mm diameter×4 mm thickness). The size of the magnetic core 105 is (100 mm diameter×30 mm thickness). The size of the circumferential magnet 103 is (150 mm inner diameter, 170 mm outer diameter, and 10 mm thickness). The intensity of the magnetic field at the surface of the target 102 is 150 gauss or more.

Existent Example (Second Invention)

For better understanding, with reference to FIGS. 10(a) and 10(b), a distribution diagram of lines of magnetic force is to be described at first for an existent example, that is, in a case of using only the rear surface magnetic 104.

With reference to FIG. 10(a), lines of magnetic force emitting from the rear surface magnet 104 are directed to the surface of the substrate 107 under divergence while being inclined to the outer circumferential direction of the rear surface magnet 104.

With reference to FIG. 10(b), lines of magnetic force passing the evaporation surface of the target 102 diverge from the rear surface to the front surface of the target 102 while being inclined in the outer circumferential direction of the target 102.

[First Exemplary Invention (Second Invention)]

With reference to FIGS. 11(a) and 11(b), a distribution of lines of magnetic force in a case of using the arc evaporation source 101a according to the first embodiment of the second invention is to be described.

With reference to FIG. 11(a), lines of magnetic force emitting from the rear surface magnetic 104 are suppressed from diverging at a position for the circumferential magnet 103 and the density of the lines of magnetic force passing the target 102 is higher than that of the existent example particularly near the center of the target 102.

With reference to FIG. 11(b), the lines of magnetic force passing the evaporation surface of the target 102 are substantially vertical to the evaporation surface of the target 102 (that is, substantially parallel with the normal line on the target).

[Second Exemplary Invention (Second Invention)]

With reference to FIGS. 12(a) and 12(b), a distribution of lines of magnetic force in a case of using the arc evaporation source 101b according to the second embodiment of the second invention is to be described.

With reference to FIG. 12(a), lines of magnetic force emitting from the rear surface magnet 104 are suppressed from diverging at a position for a circumferential magnet 103 and the density of lines of magnetic force passing a target 102 is higher than that of the existent example particularly near the center of the target 102.

With reference to FIG. 12(b), the lines of magnetic force passing the evaporation surface of the target 102 are substantially vertical to the evaporation surface of the target 102 (that is, substantially parallel with the normal line on the target). Further, when the exemplary invention is compared with the existent example, from the center to the rear surface side in the direction of the thickness of the target 102, it can be seen that the lines of magnetic force at the outer circumference of the exemplary invention are more parallel relative to the normal line on the target. Accordingly, it can be said that the density of the lines of the magnetic force in the target 102 is more uniform than that of the existent example.

FIGS. 14(a) and 14(b) illustrate a distribution of lines of magnetic force in an modified example to the exemplary invention. The arc evaporation source illustrated in FIGS. 14(a) and 14(b) has a target 102, a circumferential magnet 103, and a rear surface magnet 104 in the same manner as in the arc evaporation source 101b in FIGS. 12(a) and 12(b) according to the second embodiment of the second invention. In the arc evaporation source of FIGS. 14(a) and 14(b), the circumferential magnet 103 is disposed behind the rear surface of the target 102 different from the arc evaporation source 101b in FIGS. 12(a) and 12(b). In this case, the front end of the circumferential magnet 103 is situated behind the rear surface of the target 102 by about 5 mm to 10 mm.

In the distribution diagrams of lines of magnetic force in FIGS. 14(a) and 14(b), it can be seen that the lines of magnetic force at the front surface (evaporation surface) of the target 102 diverge while being inclined more to the radial outer side of the target 102 relative to the evaporation surface than that in FIGS. 12(a) and 12(b). This is not preferred, since the arc discharge is localized to the outer circumference of the target 102.

That is, in the arc evaporation source having the target 102, the circumferential magnet 103, and the rear surface magnet 104, it is not preferred that the circumferential magnet 103 is disposed behind the rear surface of the target 102.

FIGS. 15(a) and 15(b) illustrate a distribution of lines of magnetic force in another modified example to the exemplary invention. The arc evaporation source illustrated in FIGS. 15(a) and 15(b) has a target 102, and an circumferential magnet 103 in the same manner as the arc evaporation source 101b in FIGS. 12(a) and 12(b) according to the second embodiment of the second invention. However, a solenoid coil 110 which is a ring-shaped solenoid having the same constitution as that of the solenoid coil 109 is used instead of the surface magnet 104 comprising the permanent magnet. The position of the circumferential magnet 103 to the target 102 in the arc evaporation source of FIGS. 15(a) and 15(b) is substantially identical with the position for the circumferential magnet 103 of the arc evaporation source 101b in FIGS. 12(a) and 12(b). The solenoid coil 110 is disposed substantially coaxially with the target 102 at a position substantially identical with that of the rear surface magnet 104 in FIGS. 12(a) and 12(b). The solenoid coil 110 has about 100 mm inner diameter, 200 mm outer diameter, and about 50 mm thickness. The solenoid coil 110 is disposed behind the target 102 by about 64 mm. The magnetic force of the solenoid coil 110 is adjusted such that the magnetic flux density at the front surface of the target 102 is substantially identical with the case of using the rear surface magnet 104.

In the distribution diagram of lines of magnetic force in FIGS. 15(a) and 15(b), it can be seen that a magnetic field substantially equivalent with that of the distribution diagram of lines of magnetic force in FIGS. 12(a) and 12(b) is formed. That is, it can be said that a substantially equivalent magnetic field can be formed also in a case of using the solenoid coil 110 instead of the rear surface magnet 104 comprising the permanent magnet.

[Third Exemplary Invention (Second Invention)]

With reference to FIGS. 13(a) and 13(b), a distribution of lines of magnetic force in a case of using the arc evaporation source 101c according to a third embodiment of the second invention is to be described.

With reference to FIG. 13(a), lines of magnetic force emitting from the rear surface magnet 104 is restricted from diverging at a position of the circumferential magnet 103, and the density of the lines of magnetic force passing the target 102 is higher than that of the existent example particularly near the center of the target 102. Lines of magnetic force that have passed the evaporation surface of the target 102 and are being diverged are suppressed from diverging at the position of the solenoid coil 109 and again become substantially parallel with the normal line on the target.

With reference to FIG. 13(b), lines of magnetic force passing the evaporation surface of the target 102 are substantially vertical to the evaporation surface of the target 102, or inclined centrally to the target 102. Thus, it can be said that the lines of magnetic force in the third exemplary invention become most parallel to the normal line on the target in the direction of the thickness of the target 102 from the center to the rear surface, compared with the existent example and the first and second exemplary inventions.

FIGS. 16(a) and 16(b) illustrate a distribution of lines of magnetic force in a modified example of the exemplary invention. The arc evaporation source illustrated in FIGS. 16(a) and 16(b) has a target 102, a circumferential magnet 103, a rear surface magnet 104, and a solenoid coil 109 in the same manner as the arc evaporation source 101c of FIGS. 13(a) and 13(b) according to the third embodiment of the second invention. In the arc evaporation source of FIGS. 16(a) and 16(b), the circumferential magnet 103 is disposed behind the rear surface of the target 102 different from the arc evaporation source 101c of FIGS. 13(a) and 13(b). In the example, the front end of the circumferential magnet 103 is situated behind the rear surface of the target 102 by about 5 mm to 10 mm.

For the distribution diagram of the lines of magnetic force in FIGS. 16(a) and 16(b), it can be seen that a magnetic field substantially equivalent with the distribution diagram of the lines of magnetic force in FIGS. 13(a) and 13(b) is formed. In this modified example, it can be seen that a magnetic field substantially equivalent with that of the distribution diagram of the lines of magnetic force in FIGS. 13(a) and 13(b) can be formed even when the circumferential magnet 103 is disposed at the back of the rear surface of the target 102 by about 5 mm to 10 mm. That is, in the constitution of this modified example, it can be seen that an allowable range in accordance with the size of each of the constituent members and the density of the generated lines of magnetic force is present for the distance between the front end of the circumferential magnet 103 and the rear surface of the target 102 in order to form a magnetic field substantially equivalent with that of the distribution diagram of lines of magnetic force in FIGS. 13(a) and 13(b). The allowable range is about twice the thickness of the target 102.

FIGS. 17(a) and 17(b) illustrate a distribution of lines of magnetic force in another modified example of the exemplary invention. The arc evaporation source illustrated in FIGS. 17(a) and 17(b) has a target 102, a circumferential magnet 103, and a solenoid coil 109 in the same manner as the arc evaporation source 101c in FIGS. 13(a) and 13(b) according to the third embodiment of the second invention. However, a solenoid coil 110 is used instead of the rear surface magnet 102 comprising the permanent magnet. In the arc evaporation source of FIGS. 12(a) and 12(b), the position of the circumferential magnet 103 to the target 102 is substantially equal with the position in the arc evaporation source 101c in FIGS. 13(a) and 13(b). The solenoid coil 110 has the substantially identical constitution with that of the solenoid coil 110 in FIGS. 15(a) and 15(b) and is disposed substantially coaxially with the target 102 at a position substantially identical with that of the rear surface magnet 104 in FIGS. 13(a) and 13(b). In FIGS. 17(a) and 17(b), the solenoid coil 110 is disposed behind the target 102 by about 64 mm.

In the distribution diagram of lines of magnetic force in FIGS. 17(a) and 17(b), it can be seen that a magnetic field substantially equivalent with the distribution diagram of lines of magnetic force in FIGS. 13(a) and 13(b) is formed. That is, it can be said that a substantially equivalent magnetic field can be formed also in a case of using the solenoid coil 110 instead of the rear surface magnet 104 comprising the permanent magnet.

[Third Invention]

A third invention of the present invention is to be described with reference to FIGS. 18 to 25.

First Embodiment (Third Invention)

A first embodiment of a third invention is to be described with reference to FIG. 18 to FIG. 21. FIG. 18 illustrate a film deposition apparatus 206 provided with an arc evaporation source 201a according to the first embodiment of the third invention (hereinafter referred to as an evaporation source 201a).

A film deposition apparatus 206 comprises a chamber 211, and a rotary table 212 for supporting a substrate 207 as an object to be processed, and an evaporation source 201a which is attached being opposed to the substrate 207 are disposed in the chamber 201. The chamber 211 has a gas introduction port 213 for introducing a reaction gas into the chamber 211 and a gas exhaust port 214 for exhausting a reaction gas from the inside of the chamber 211.

In addition, the film deposition apparatus 206 comprises an arc power source 215 for applying a negative bias to a target 202 of the evaporation source 201a (to be described later), and a bias power source 216 for applying a negative bias to the substrate 207. Positive electrodes of the arc source 215 and the bias power source 216 are grounded to a ground 218.

As illustrated in FIG. 18, the evaporation source 201a comprises a disk-shaped target 202 having a predetermined thickness which is disposed with the evaporation surface being faced to the substrate 207 and a magnetic field forming unit 208a disposed near the target 202. The term "disk-shaped" also means a circular cylindrical shape of a predetermined height. The magnetic field forming unit 208a comprises a circumferential magnet 203 and a rear surface magnet 204a. In this embodiment, the chamber 211 acts as an anode. With such a constitution, the evaporation source 201a serves as a cathode discharge arc evaporation source.

Figure 19:
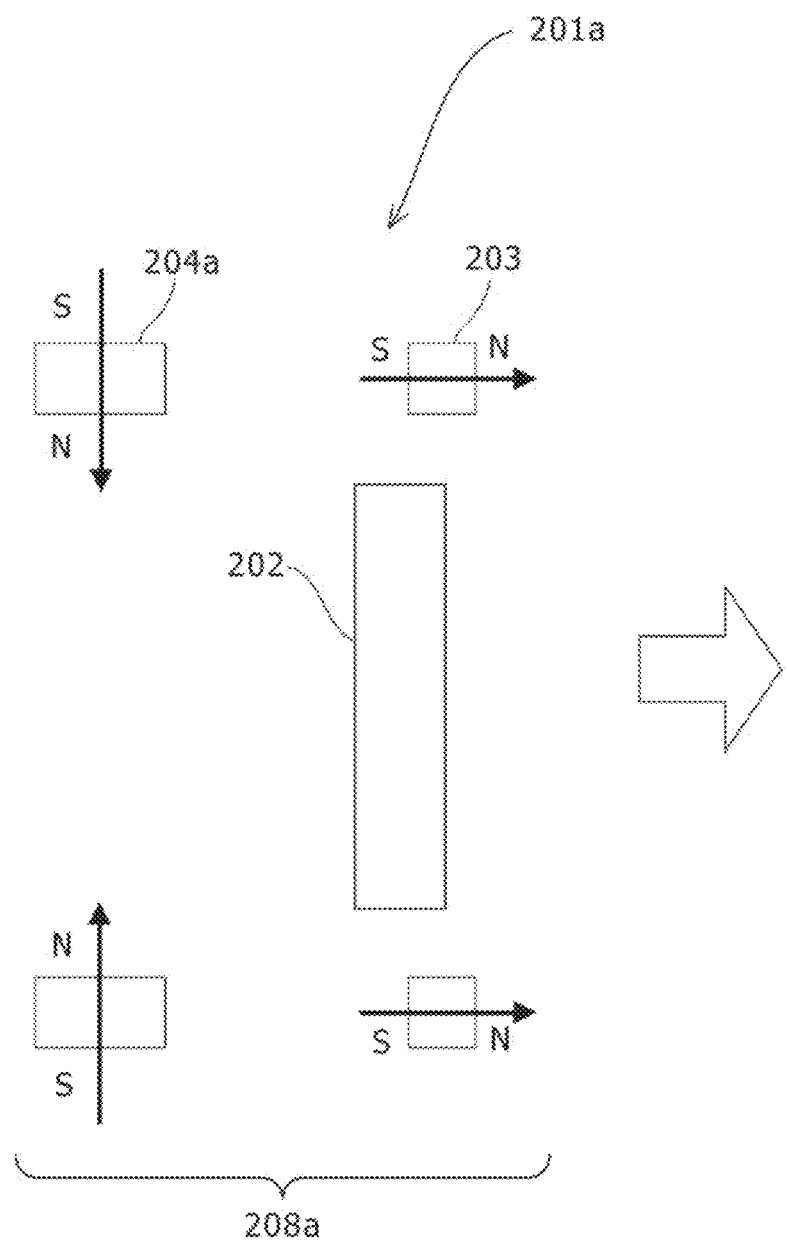
FIG. 19 is a view illustrating a schematic constitution of an arc evaporation source according to a first embodiment of the third invention.

With reference to FIG. 18 and FIG. 19, the constitution of the evaporation source 201a provided to the film deposition apparatus 206 is to be described below. FIG. 19 is a view illustrating a schematic constitution of the evaporation source 201a according to this embodiment.

As described above, the evaporation source 201a comprises the disk-shaped target 202 having a predetermined thickness and the magnetic field forming unit 208a disposed near the target 202.

In the following description, the surface of the target 202, as an evaporation surface, facing the substrate 207 (in the direction to the substrate indicated by a blank arrow) is referred to as "front surface (target front surface)" and the surface facing the opposite side is referred to as "rear surface" (target rear surface) (refer to FIG. 18 and FIG. 19).

The target 202 comprises a material which is selected in accordance with a thin film to be formed on the substrate 207. The material includes ionizable materials such as metal materials, for example, chromium (Cr), titanium (Ti), and titanium aluminum (TiAl), and carbon (C).

The magnetic field forming unit 208a has a ring-shaped (annular or doughnut-shaped) circumferential magnet 203 disposed so as to surround the outer circumference of the target 202 and a ring-shaped (annular or doughnut-shaped) rear surface magnet 204a disposed coaxially with the circumferential magnet 203 on the side of the rear surface of the target 202. The circumferential magnet 203 and the rear surface magnet 204a each comprise a permanent magnet formed of a neodymium magnet having high coercivity.

That is, the evaporation source 201a is constituted by arranging the target 202, the circumferential magnet 203, and a rear surface magnet 204a by substantially aligning the axes thereof to each other.

The circumferential magnet 203 is a ring body as described above and has an inner diameter which is somewhat larger (by about 1 to 2 times) than the diameter of the target 202, and has a predetermined thickness along the axial direction. The thickness of the circumferential magnet 203 is substantially equal with or somewhat smaller than the thickness along the axial direction of the target 202.

The ring-shaped circumferential magnet 203 comprises, in appearance, two surfaces of toroids (toroidal surfaces) parallel with each other and two circumferential surfaces connecting the two toroidal surfaces in the axial direction. The two circumferential surfaces comprise an inner circumferential surface formed to the inner circumference of the toroidal surface and an outer circumferential surface formed to the outer circumference of the toroidal surface. The width for the inner circumferential surface and the outer circumferential surface is a thickness of the circumferential magnet 203 (thickness in the axial direction).

The shape of the inner circumferential surface of the circumferential magnet 203 is formed such that when the circumferential magnet 203 and the target 202 are projected along the direction crossing the front surface of the target 202, the shape of the projection shadow of the inner circumferential surface of the circumferential magnet 203 and the shape of the projection shadow of the target 202 are similar to each other.

As shown in FIG. 19, the circumferential magnet 203 has a N-pole at the front toroidal surface (front end surface) facing the substrate 207 and a S-pole at the rear toroidal surface (rear end face) facing the opposite side. The drawing shows arrows directing from the rear toroidal surface (S-pole) to the front toroidal surface (N-pole) of the circumferential magnet 203 and the direction of the arrow is hereinafter referred to as the direction of magnetization. The circumferential magnet 203 of this embodiment is disposed such that the direction of magnetization is along the direction crossing the front surface of the target 202 and is directed forward.

As described above, the circumferential magnet 203 preferably has an integrated ring-like or annular shape. However, the circumferential magnet 203 may also comprise a plurality of circular cylindrical or cuboidal magnets arranged in a ring-like or annular shape such that the direction of magnetization is along the direction crossing the front surface of the target 202 and is directed forward.

The circumferential magnet 203 is disposed coaxially with the target 202 so as to surround the outer circumference of the target 202. In this case, the front toroidal surface of the circumferential magnet 203 is on a plane identical with the front surface of the target 202 and they are flush with each other, or is disposed ahead of the front surface of the target 202.

For example, in FIG. 19, the target 202 is disposed such that the front surface thereof does not exceed the range of the thickness of the circumferential magnet 203. Accordingly, in this embodiment, they are arranged such that a projection shadow of the circumferential magnet 203 as viewed in the radial direction overlaps a projection shadow of the target 202 as viewed in the radial direction. That is, the circumferential magnet 203 is disposed such that the projection shadows, which are formed when the circumferential magnet 203 and the target 202 are projected in a direction parallel with the front surface (evaporation surface) of the target 202, overlap to each other and the projection shadow of the circumferential magnet 203 is completely included in the projection shadow of the target 202.

As described above, the circumferential magnet 3 is disposed to the evaporation source 201a such that the front end face is on a plane identical with the front surface of the target 202 or situated ahead of the front surface of the target 202.

The rear surface magnet 204a is a ring body having a diameter substantially identical with that of the circumferential magnet 203 and has an inner diameter and an outer diameter substantially equal with those of the circumferential magnet 203. Accordingly, the rear surface magnet 204a has an inner diameter somewhat larger than the diameter of the target 202 (about 1 to 2 times) and a predetermined thickness along the axial direction. The thickness of the circumferential magnet 203 is somewhat larger than the thickness of the target 202 and about twice the thickness of the circumferential magnet 203.

The ring-shaped rear surface magnet 204a also comprises, in appearance, two toroidal surfaces (front end face and rear end face) parallel with each other and two circumferential surface connecting the two toroidal surfaces in the axial direction (inner circumferential surface and outer circumferential surface) in the same manner as the circumferential magnet 203. The width of the inner circumferential surface and that of the outer circumferential surface is a thickness of the circumferential magnet 203 along the axial direction.

As shown in FIG. 19, the rear surface magnet 204a is formed such that the inner circumferential surface forms a N-pole and the outer circumferential surface forms a S-pole. The drawing shows solid arrows indicating the direction of magnetization from the outer circumferential surface (S-pole) to the inner circumferential surface (N-pole) of the rear surface magnet 204a. The rear surface magnet 204a of this embodiment is disposed such that the direction of magnetization is parallel with the front surface of the target 202 and is directed to the radial inside.

In the circumferential magnet 203 and the rear surface magnet 204a of such a constitution, the front end surface of the circumferential magnet 203 and the inner circumferential surface of the rear surface magnet 204a have an identical polarity and, in this state, the respective directions of magnetization are vertical to each other.

As described above, since the direction of magnetization of the circumferential magnet 203 and that of the rear surface magnet 204 are vertical to each other, the magnetic field formed by the circumferential magnet 203 and the magnetic field formed by the rear surface magnet 204a can be combined. Thus, the direction of lines of the magnetic force passing the evaporation surface of the target 202 can be made substantially vertical to the evaporation surface. Further, this also provides an effect capable of generating lines of magnetic force of high straightness that extend from the surface of the target 202 to the substrate 207 in a wide region on the surface of the target 202.

As has been described above, it may suffice that the front end face of the circumferential magnet 203 and the inner circumferential surface of the rear surface magnet 204a have an identical polarity, and that the magnetization direction of the circumferential magnet 203 and the magnetization of the rear surface magnet 204a are in the directions vertical to each other. Accordingly, the polarity of the circumferential magnet 203 and the polarity of the rear surface magnet 204a may be reversed to those of the configuration described above shown in FIG. 2, in which the direction of magnetization of the circumferential magnet 203 and the direction of magnetization of the rear surface electrode 204a may be reversed respectively.

Then, a film deposition method in the film deposition apparatus 206 using the evaporation source 201a is to be described.

At first, after evacuating the chamber 211 by vacuum drawing, an inert gas such as an argon gas (Ar) is introduced from the gas introduction port 213 and impurities such as oxides on the target 202 and the substrate 207 are removed by gas sputtering. After removing the impurities, inside of the chamber 211 is again evacuated and a reaction gas is introduced from the gas introduction port 213 into the evacuated chamber 211.

When arc discharge is generated in this state on the target 202 installed in the chamber 211, materials constituting the target 202 are converted into plasmas and reacted with the reaction gas. Thus, a nitride film, an oxide film, a carbide film, a carbonitride film, an amorphous carbon film, etc. can be formed on the substrate 207 placed on the rotary table 212.

As the reaction gas, a nitrogen gas ($N_2$) or an oxygen gas ($O_2$), or a hydrocarbon gas such as methane ($CH_4$) may be selected according to the application use and the pressure of the reaction gas in the chamber 211 may be at about 1 to 10 Pa. Further, during film deposition, the target 202 is subjected to discharge by flowing an arc current of 100 to 200 A and applying a negative voltage of 10 to 30 V from the arc power source 215. Further, a negative voltage of 10 to 200 V may be applied to the substrate 207 by the bias power source 216.

Further, it is preferred to constitute and arrange the circumferential magnet 203 and the rear surface magnet 204 such that the magnetic field on the front surface of the target 202 is 100 gauss or more. Thus, a film can be deposited reliably. The magnetic field on the front surface of the target 202 is more preferably 150 gauss.

[First Exemplary Invention (Third Invention)]

Figure 20:
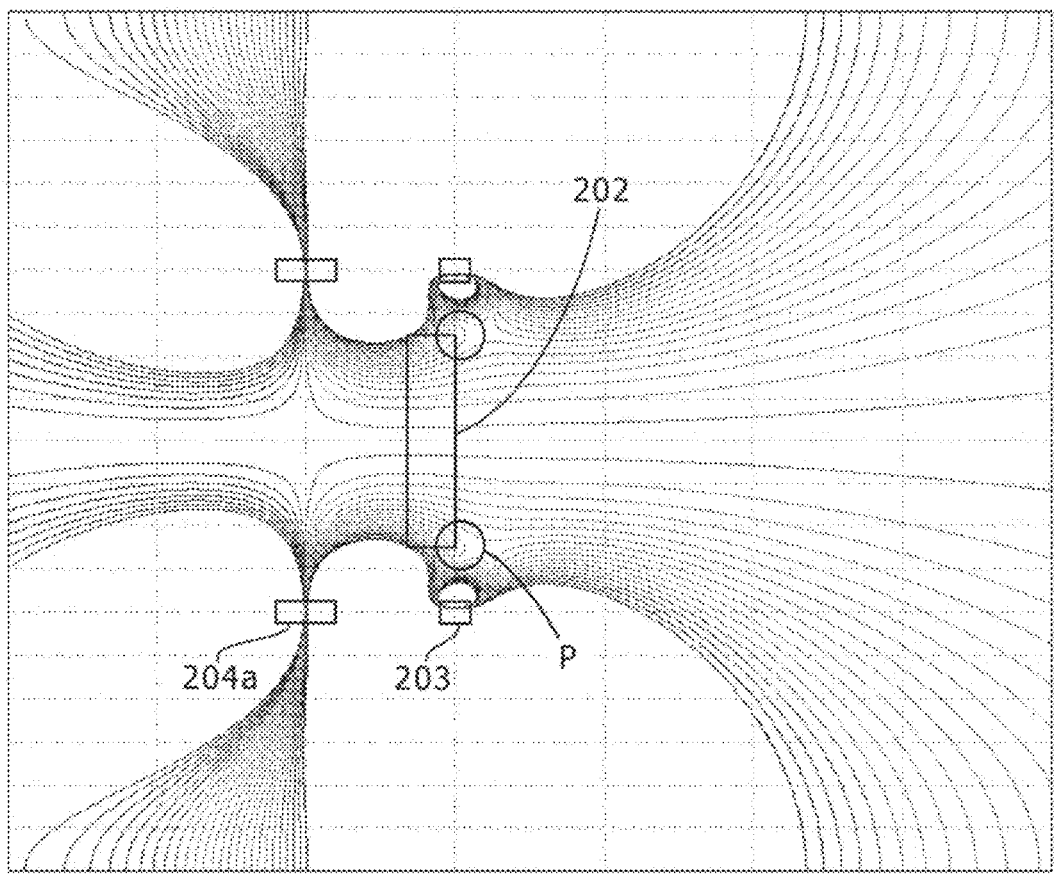
FIG. 20 is a view illustrating a distribution of lines of magnetic force of an arc evaporation source according to the first embodiment of the third invention.

With reference to FIG. 20, a distribution of lines of magnetic force generated in the evaporation source 201a according to the first embodiment is to be described. A distribution diagram of lines of magnetic force illustrated in FIG. 20 shows a distribution of lines of magnetic force from the back of the rear surface magnet 204a to the surface of the substrate 207. In the distribution diagram of the lines of magnetic force of FIG. 20, the right end shows a position for the surface of the substrate 207.

Various experimental conditions are shown below. For example, the size of the target 202 is (100 mm diameter×16 mm thickness). The size of the circumferential magnet 203 is (150 mm inner diameter, 170 mm outer diameter, and 10 mm thickness), and the distance from the surface of the target 202 to the circumferential magnet 203 is 5 mm. The size of the rear surface magnet 204a is (150 mm inner diameter, 170 mm outer diameter, and 20 mm thickness), and the distance from the surface of the target 202 to the rear surface magnet 204a is 40 mm. The intensity of the magnetic field at the surface of the target 202 is 150 gauss or more.

With reference to FIG. 20, lines of magnetic force emitting radially inside from the rear surface magnet 204a extend substantially vertical to the target 202 while changing the progressing direction so as to be along the axial direction of the rear surface magnet 204a. Such lines of magnetic force are combined with the lines of magnetic force emitting from the circumferential magnet 203 and pass the evaporation surface of the target 202. From the evaporation surface of the target 202, lines of magnetic force of high straightness that extend in the direction to the substrate are generated in a wide region at the evaporation surface of the target 202. In other words, a great amount of vertical lines of magnetic force (vertical components) are generated in the wide region at the evaporation surface of the target 202.

In the drawing, attention is paid to lines of magnetic forces at portions surrounded by two circles P at the outer circumference of the target 202 in FIG. 20. Lines of magnetic force after emitting from the evaporation surface at the target 202 are curved at two circles P to the radial outside of the target 202, that is, to the circumferential magnet 203. This indicates that the components of the lines of the magnetic force vertical to the evaporation surface of the target 202 are not substantially present at the outer circumference of the target 202 surrounded by the two circles P.

Electron emission points (arc spots) on the cathode side generated in the film deposition apparatus 206 tend to be trapped to a place where the components of the magnetic force substantially parallel with the evaporation surface of the target 202 are present, that is, to a place where the components of lines of magnetic force vertical to the evaporation surface of the target 202 are not present. That is, the first exemplary invention can avoid a disadvantage that the arc spots moving at a high speed on the evaporation surface of the target 202 move to the outside of the evaporation surface of the target 202 beyond the outer circumference of the target 202. Thus, the arc spots can be retained on the evaporation surface of the target 202.

Comparative Example (Third Invention)

For clarifying the feature and the effect of the evaporation source 201a according to this embodiment, description is to be made on a comparative example relative to the first exemplary invention described above.

Figure 21:
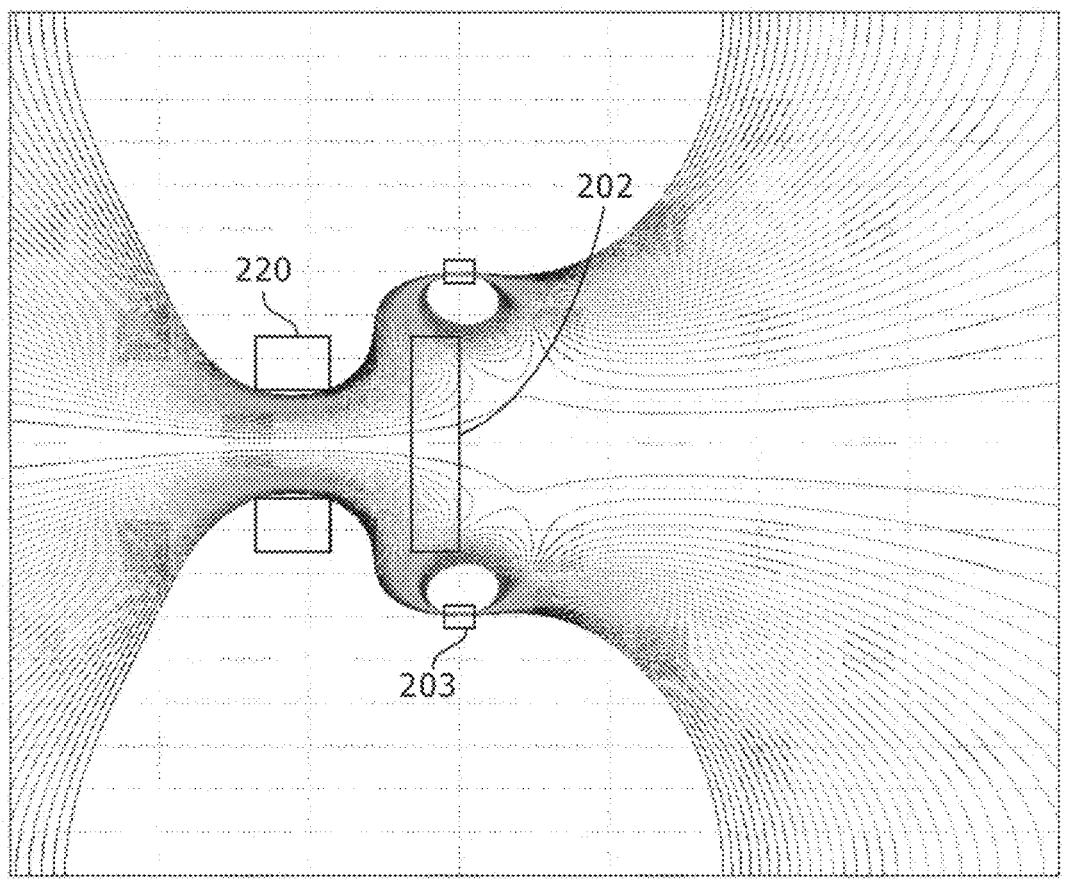
FIG. 21 is a view illustrating a distribution of lines of magnetic force in an arc evaporation source according to a comparative example.

FIG. 21 illustrates a distribution of lines of magnetic force generated in the evaporation source according to this comparative example. The evaporation source according to the comparative example comprises a target and an circumferential magnet identical with those of the evaporation source 201a according to the first embodiment, and also has a rear surface electromagnet 220 comprising a solenoid coil instead of the rear surface magnet 204a of the evaporation source 201a. The evaporation source according to this comparative example has a constitution similar with that of the arc evaporation device disclosed in the cited Patent reference 4.

Also the distribution diagram of lines of magnetic force shown in FIG. 21 shows a distribution of lines of magnetic force from the back of the rear surface electromagnet 220 to the surface of the substrate. In the distribution diagram of lines of magnetic force illustrated in FIG. 21, the right end shows a position for the surface of the substrate.

Various experimental conditions are shown below. For example, the size of the target is (100 mm diameter×16 mm thickness). The size of the circumferential magnet is (150 mm inner diameter, 170 mm outer diameter, and 10 mm thickness), and the distance from the surface of the target 202 to the circumferential magnet 203 is 5 mm. The size of the rear surface electromagnet 20 is (50 mm inner diameter, 100 mm outer diameter, and 25 mm thickness) and the distance from the surface of the target 202 to the rear surface electromagnet 20 is 45 mm. The magnetic field intensity at the surface of the target 202 is 150 gauss or more.

With reference to FIG. 21, lines of magnetic force emitting from the outer circumference relative to the central region within the diameter of the solenoid coil diverge outwardly relative to the axis of the solenoid coil just after leaving the solenoid coil. The diverged lines of magnetic force further diverge in the target and are directed sideway of the target without reaching the front surface of the target.

On the other hand, lines of magnetic force at high straightness emit from the central region of the rear surface electromagnet 220 and the lines of magnetic force transmit the front surface of the target. However, the density of straight forwarding lines of magnetic force is extremely lower than that of the first exemplary invention shown in FIG. 20.

Further, a distribution of lines of magnetic force corresponding to the portion of circles P illustrated in FIG. 20 for explaining the first exemplary invention is not present to the outer circumference of the target in this comparative example. That is, it can be said that retainment of the arc spots on the evaporation surface of the target is difficult in this comparative example.

Second Embodiment (Third Invention)

A second embodiment of the third invention is to be described with reference to FIG. 22 and FIG. 23.

Figure 22:
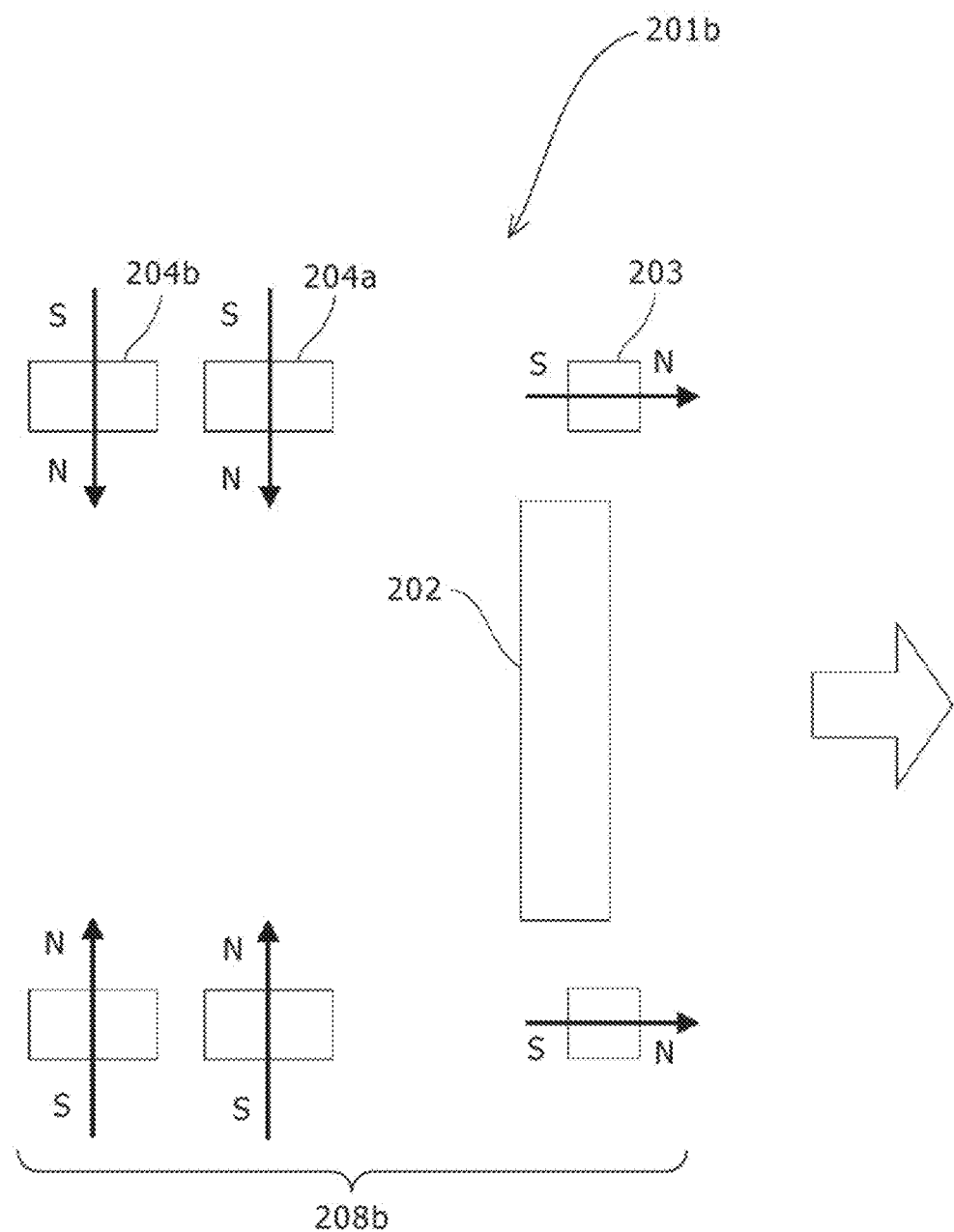
FIG. 22 is a view illustrating a schematic constitution of the arc evaporation source according to the second embodiment of the third invention.

FIG. 22 is a view illustrating a schematic constitution of an arc evaporation source 201b according to a second embodiment of the third invention (hereinafter referred to as an evaporation source 201b). A film deposition apparatus 206 according to this embodiment has an evaporation source 201b to be described later instead of the evaporation source 201a according to the first embodiment of the second invention. In the film deposition apparatus 206 according to this embodiment, constitutions other than the evaporation source 201b are identical with those described in the first embodiment of the third invention, and identical constituent elements carry same reference numerals, for which descriptions are to be omitted.

The evaporation source 201b in this embodiment comprises a disk-shaped target 202 having a predetermined thickness and a magnetic field forming unit 208b disposed near the target 202 in the same manner as the evaporation source 201a in the first embodiment of the third invention. The magnetic field forming unit 208b has a circumferential magnet 203 and a rear surface magnet 204a alike the first embodiment and, further, has a rear surface magnet 204a and has a rear surface magnet 204b (second rear surface magnet) having the same constitution as that of the rear surface magnet 204a, which is a ring body having a diameter substantially identical with that of the circumferential magnet 203.

The ring-shaped rear surface magnet 204b is disposed at the back of the rear surface magnet 204a and coaxially with the rear surface magnet 204a and the circumferential magnet 203. Thus, the direction of magnetization of the rear surface magnet 204b is parallel and identical with the direction of the magnetization of the rear surface magnet 204a. While the rear surface magnet 204a and the rear surface magnet 204b are adjacent to each other, the distance between them is not always arbitrary. It is preferred that the rear surface magnet 204a and the rear surface magnet 204b are disposed being close to each other so that repulsion exerts between the rear surface magnet 204a and the rear surface magnet 204b to each other.

As illustrated in FIG. 22, when the rear surface magnet 204a and the rear surface magnet 204b are disposed coaxially being close to each other, lines of magnetic force emitting from the rear surface magnet 204a and diverging to the rear surface magnet 204b and lines of magnetic force emitting from the rear surface magnet 204b and diverging to the rear surface magnet 204a repel to each other. By the repulsion, divergence of lines of magnetic force between the rear surface magnet 204a and the rear surface magnet 204b is suppressed, and a great amount of lines of magnetic force at high straightness can be generated within the diameter of the rear surface magnet 204a and the rear surface magnet 204b.

[Second Exemplary Invention (Third Invention)]

Figure 23:
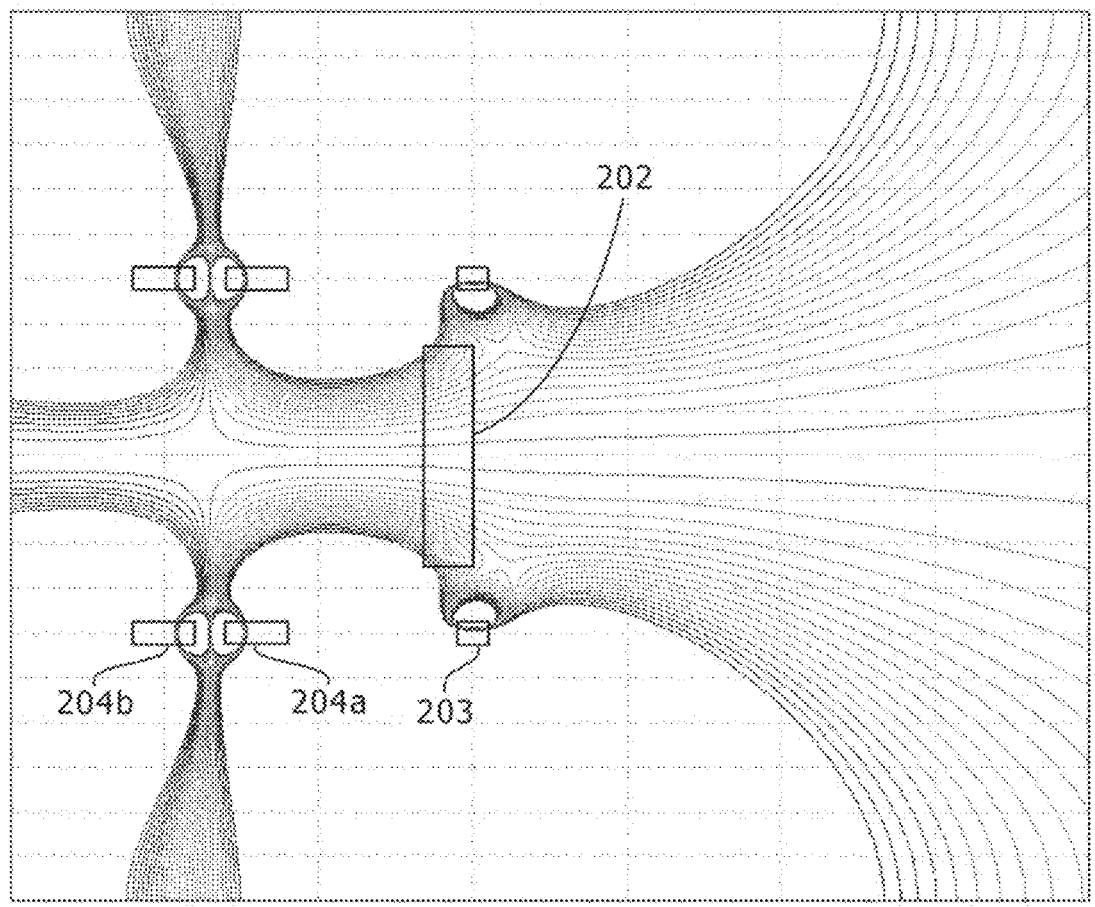
FIG. 23 is a view illustrating a distribution of lines of magnetic force of an arc evaporation source according to the second embodiment of the third invention.

With reference to FIG. 23, a distribution of lines of magnetic force generated in the evaporation source 201b according to the second embodiment of the third invention is to be described. A distribution diagram of lines of magnetic force illustrated in FIG. 23 shows a distribution of lines of magnetic force from the back of the rear surface magnet 204b to the surface of the substrate 207. In the distribution diagram of lines of magnetic force in FIG. 23, the right end indicates a position for the surface of the substrate 207.

Various experimental conditions are shown below. For example, the size of a target 202 is (100 mm diameter×16 mm thickness). The size of a circumferential magnet 203 is (150 mm inner diameter, 170 mm outer diameter, and 10 mm thickness), and the distance from the surface of the target 202 to the circumferential magnet 203 is 5 mm.

The size of the rear surface magnet 204a is (150 mm inner diameter, 170 mm outer diameter, and 20 mm thickness) and the distance from the surface of the target 202 to the rear surface magnet 204a is 60 mm. The size of the rear surface magnet 204b is (150 mm inner diameter, 170 mm outer diameter, and 20 mm thickness) and the distance from the surface of the target 202 to the rear surface magnet 204b is 90 mm. The distance between the rear surface magnet 204a and the rear surface magnet 204b is 10 mm.

The magnetic field intensity at the surface of the target 202 is 150 gauss or more.

Referring to FIG. 23, a great amount of lines of magnetic force of high straightness emit from the rear surface magnet 204a and the rear surface magnet 204b in a radially inward direction. Lines of magnetic force extend substantially vertically to the target 202 while changing the progressing direction so as to be along the axial direction of the rear surface magnet 204a and the rear surface magnet 204b. The lines of magnetic force are combined with the lines of magnetic force emitting from the circumferential magnet 203 and pass the evaporation surface of the target 202. Lines of magnetic force at high straightness are generated from the evaporation surface of the target 202 to the direction of the substrate in a wide region at the evaporation surface of the target 202. In other words, a great amount of lines of magnetic force (vertical components) are generated in the wide region at the evaporation surface of the target 202.

Then, FIG. 20 for the first exemplary invention and FIG. 23 for this exemplary invention are compared. In FIG. 20 and FIG. 23, the range and the configuration of the distribution of lines of magnetic force are substantially identical. However, in FIG. 23, the straightness and the density of the lines of magnetic force extending along the radial inside direction of the rear surface magnet 204a and the rear surface magnet 204b and the lines of magnetic force extending from both of the rear surface magnets along the axis of the target 202 to the substrate 207 are higher than those in the case of FIG. 20 in which the rear surface magnet 204 is disposed.

Also in FIG. 23, regions where the components of lines of magnetic force vertical to the evaporation surface are not substantially present are formed to the outer circumference of the target 202 alike the regions indicated by the circles P in FIG. 20 for the first exemplary invention. Accordingly, also in this exemplary invention, the disadvantage that arc spots move to the outside of the evaporation surface of the target 202 beyond the outer circumference of the target 202 can be avoided and the arc spots can be retained on the evaporation surface of the target 202.

Third Embodiment (Third Invention)

Figure 24:
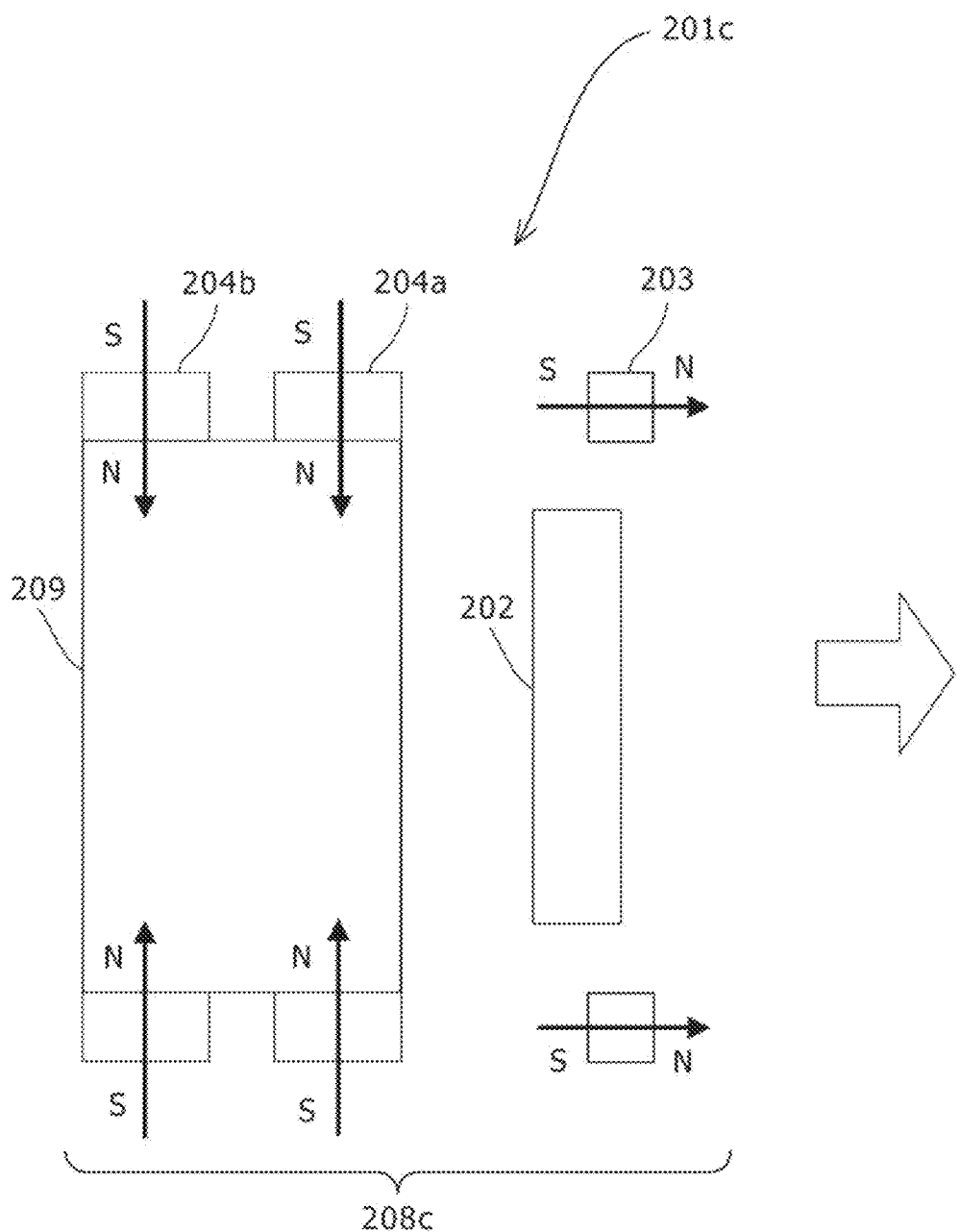
FIG. 24 is a view illustrating a schematic constitution of an arc evaporation source according to a third embodiment of the third invention.
Figure 25:
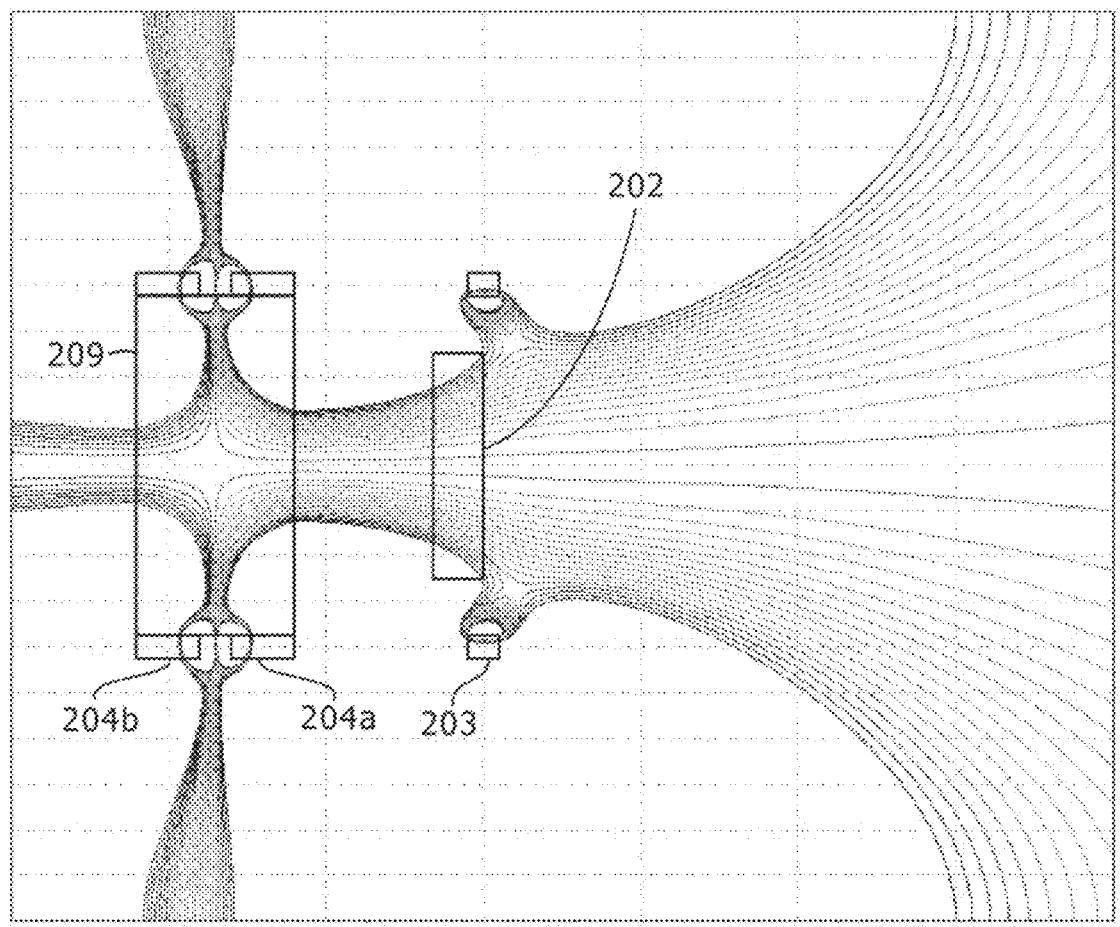
FIG. 25 is a view illustrating a distribution of lines of magnetic force of an arc evaporation source according to the third embodiment of the third invention.

With reference to FIG. 24 and FIG. 25, a third embodiment of the third invention is to be described.

FIG. 24 is a view illustrating a schematic constitution of an arc evaporation source 201c according to the third embodiment of the third invention (hereinafter referred to as an evaporation source 201c). film deposition apparatus 206 according to this embodiment is provided with the evaporation source 201c to be described later instead of the evaporation source 201b according to the second embodiment of the third invention. In the film deposition apparatus 206 of this embodiment, other constitutions than the evaporation source 201c are identical with those described for the second embodiment of the third invention, and identical constituent elements carry same reference numerals, for which descriptions are to be omitted.

The evaporation source 201c in this embodiment comprises a disk-shaped target 202 having a predetermined thickness and a magnetic field forming unit 208c disposed near the target 202 in the same manner as the evaporation source 201b in the second embodiment of the third invention. The magnetic field forming unit 208c has a circumferential magnet 203, a rear surface magnet 204a, and a rear surface magnet 204b in the same manner as the second embodiment of the third invention and, further, comprises a single magnetic body 209 in the radial inside of the rear surface magnet 204a and the rear surface magnet 204b.

The magnetic body 209 is a non-ring shaped magnetic core which constitutes a core for the rear surface magnet 204a and the rear surface magnet 204b. The magnetic body 209 is disposed so as to penetrate the rear surface magnet 204a and the rear surface magnet 204b, and has a disk-shape or circular columnar shape having a diameter identical with the inner diameter of the rear surface magnet 204a and the rear surface magnet 204b. The "non-ring shaped" means not an annular shape in which an aperture is formed in the radial inside like a doughnut but means a solid configuration such as a disk shape or a circular cylindrical shape.

In other words, the rear surface magnet 204a and the rear surface magnet 204b are disposed so as to surround the outer circumference of one magnetic body 209 in close contact therewith. In such an arrangement, the front end face of the rear surface magnet 204a is substantially flush with the front end face of the magnetic body 209, and the rear end face of the reference magnet 204b is substantially flush with the rear end face of the magnetic body 209.

Summarizing the constitution of the evaporation source 201c, it can be said that the target 202, the circumferential magnet 203, the rear surface magnet 204a, a rear surface magnet 204b, and the magnetic body 209 are disposed coaxially such that their axes are aligned with each other.

As illustrated in FIG. 24, the inner circumferential surfaces of the rear surface magnet 204a and the rear surface magnet 204b are in close contact with the lateral surface of the magnetic body 209. Thus, lines of magnetic force emitting from the end faces of the rear magnet 204a and the rear magnet 204b can be induced linearly through the magnetic body 209 in the axial direction of the rear surface magnet 204a and the rear surface magnet 204b.

Accordingly, in the magnetic body 209, repulsion of the lines of magnetic force can be increased at a position near the axes of the rear surface magnet 204a and the rear surface magnet 204b. As a result, a great amount of lines of magnetic force at high straightness can be generated from the position near the axis of the front end face of the magnetic body 209.

[Third Exemplary Invention (Third Invention)]

With reference to FIG. 25, a distribution of lines of magnetic force generated in the evaporation source 201c according to a third embodiment of the third invention is to be described. The distribution diagram of lines of magnetic force illustrated in FIG. 25 shows a distribution of lines of magnetic force from the back of the rear surface magnet 204b to the front surface of the substrate 207. In the distribution diagram of lines of magnetic force in FIG. 25, the right end indicates a position for the surface of the substrate 207.

Various experimental conditions are shown below. For example, the size of the target 202 is (100 mm diameter×16 mm thickness). The size of the circumferential magnet 203 is (150 mm inner diameter, 170 mm outer diameter, and 10 mm thickness) and the distance of the circumferential magnet 203 from the surface of the target 202 is 5 mm.

The size of the rear surface magnet 204a is (150 mm inner diameter, 170 mm outer diameter, and 20 mm thickness) and the distance from the surface of the target 2 to the rear surface magnet 204a is 60 mm. The size of the rear surface magnet 204b is (150 mm inner diameter, 170 mm outer diameter, and 20 mm thickness), and the distance from the surface of the target 202 to the rear surface magnet 204b is 90 mm. The distance between the rear surface magnet 204a and the rear surface magnet 204b is 10 mm.

The size of the magnetic body 209 is (150 mm diameter× 50 mm height).

The magnetic field intensity at the surface of the target 202 is 150 gauss or more.

Referring to FIG. 25, a greater amount of lines of magnetic force of high straightness emit from the rear surface magnet 204a and the rear surface magnet 204b in a radial inside direction than those in the case of the second exemplary invention illustrated in FIG. 23. The lines of magnetic force extend substantially vertically to the target 202 while changing the progressing direction so as to be along the axial direction near the axis of the magnetic body 209. The lines of magnetic force are combined with the lines of magnetic force emitting from the circumferential magnet 203 and pass the evaporation surface of the target 202. Lines of magnetic force of higher straightness than those in the second exemplary invention shown in FIG. 23 are generated from the evaporation surface of the target 202 in a wide region at the evaporation surface of the target 202 and extend in the direction of the substrate. In other words, a great amount of vertical lines of magnetic force (vertical components) are generated in the wide region at the evaporation surface of the target 202.

FIG. 23 for the second exemplary invention and FIG. 25 for this exemplary invention are compared. The range and the configuration of the distribution for the lines of magnetic force are substantially identical between FIG. 23 and FIG. 25. However, the lines of magnetic force illustrated in FIG. 25 are concentrated so as to converge further to the vicinity of the axes of the magnetic body 209 and the target 202 than the lines of magnetic force illustrated in FIG. 23. Accordingly, the straightness and the density of the entire lines of magnetic force are increased more in FIG. 25 than those in FIG. 23.

Further, also in FIG. 25, regions in which the components of lines of magnetic force vertical to the evaporation surface are not substantially present are formed to the outer circumference of the target 202 in the same manner as in FIG. 23 for the second exemplary invention described above. Accordingly, also in this exemplary invention, the disadvantage that arc spots move to the outside of the evaporation surface of the target 202 beyond the outer circumference of the target 202 can be avoided and the arc spots can be retained on the evaporation surface of the target 202.

The target 202 is not restricted to the disk-shaped shape but may also be a polygonal, for example, tetragonal shape. Further, the circumferential magnet 203 and the rear surface magnets 204a and 204b are not restricted to the toroidal shape but may also be an annular polygonal, for example, tetragonal shape.

By the way, it should be understood that each of the embodiments of the present invention disclosed herein is only for illustration but not limitative in all respects. Particularly, values for those matters not disclosed explicitly in each of the embodiments, for example, operation conditions measuring conditions, various parameters, and size, weight and volume of constituent components, do not depart the range usually practiced by persons skilled in the art and values that can be usually estimated easily by the persons skilled in the art are adopted.

While expression such as parallel, crossing and identical and, in addition, an expression of coaxial are used with respect to the shape and the size of each of constituent elements, for example, in the description for the evaporation source in each of the embodiments of the invention, they are not strictly defined with a mathematical point of view. Errors within such a range that they can be considered as parallel, crossing, identical and coaxial in usual fabrication accuracy for machinery parts are naturally tolerable.

While the present invention has been described with respect to the embodiments and the examples, the present invention is not restricted to the embodiments described above but can be modified and practiced within the extent described in the range of the scope of the claims. The present application is based on Japanese Patent Application filed on Feb. 23, 2011 (Japanese Patent Application No. 2011-037094), Japanese Patent Application filed on Feb. 23, 2011 (Japanese Patent Application No. 2011-037095), Japanese Patent Application filed on Apr. 25, 2011 (Japanese Patent Application No. 2011-097162), Japanese Patent Application filed on May 26, 2011 (Japanese Patent Application No. 2011-118267), and Japanese Patent Application filed on Aug. 22, 2011 (Japanese Patent Application No. 2011-180544), and the contents thereof are herein incorporated for the reference.

INDUSTRIAL APPLICABILITY

The present invention is applicable to an arc evaporation source for a film deposition apparatus that forms thin films.

LIST OF REFERENCE SIGNS 1, 101, 201a to 201c evaporation source (arc evaporation source)
2, 102, 202 target
3, 103, 203 circumferential magnet
6, 106, 206 film deposition apparatus
7, 107, 207 substrate
8, 108, 208a to 208c magnetic field forming unit
9, 109, 110 solenoid coil
11, 111, 211 vacuum chamber
12, 112, 212 rotary table
13, 113, 213 gas introduction port
14, 114, 214 gas exhaust port
15, 115, 215 arc power source
16, 116, 216 bias power source
18, 118, 218 ground
104, 204a, 204b rear surface magnet
104A first permanent magnet (disk-shaped rear surface magnet)
104B second permanent magnet (disk-shaped rear surface magnet)
105 magnetic core
220 rear surface electro magnet

The invention claimed is:

1. An arc evaporation source, comprising:
a ring-shaped circumferential magnet and a rear surface magnet,
wherein the ring-shaped circumferential magnet is disposed to an outer circumference of a target,
the rear surface magnet is disposed at a back of the target, and
one of the ring-shaped circumferential magnet and the rear surface magnet is disposed so as to have a polarity where a direction of magnetization is parallel with a front surface of the target, by which a direction of lines of magnetic force passing an evaporation surface of the target becomes substantially vertical to the evaporation surface,
wherein the rear surface magnet has a ring shape,
the ring-shaped circumferential magnet is disposed surrounding the outer circumference of the target so as to have a polarity where the direction of magnetization is along a direction crossing the front surface of the target and directing ahead or behind,
the rear surface magnet has an inner diameter larger than a size of the target and is disposed so as to have a polarity where the direction of magnetization is parallel with the front surface of the target, and
a direction of magnetization of the rear surface magnet is directed to a radial inside of the rear surface magnet when a direction of magnetization of the ring-shaped circumferential magnet is directed ahead, and
the direction of magnetization of the rear surface magnet is directed to a radial outside of the rear surface magnet when the direction of magnetization of the ring-shaped circumferential magnet is directed behind.

2. The arc evaporation source according to claim 1, comprising:
the ring-shaped circumferential magnet and
a ring-shaped magnetic field generating mechanism,
wherein the ring-shaped circumferential magnet is disposed surrounding the outer circumference of the target so as to have a polarity where the direction of magnetization is parallel with the front surface of the target, and
the ring-shaped magnetic field generating mechanism is disposed ahead of the target such that an axis of the ring-shaped magnetic field generating mechanism is along a direction substantially vertical to the front surface of the target, thereby generating a magnetic field substantially vertical to the front surface of the target.

3. The arc evaporation source according to claim 1, comprising:
the ring-shaped circumferential magnet and
the rear surface magnet,
wherein the ring-shaped circumferential magnet is disposed surrounding the outer circumference of the target so as to have a polarity where the direction of magnetization is parallel with the front surface of the target,
the rear surface magnet is disposed such that the direction of magnetization is along a direction crossing the front surface of the target, and
a magnetic pole of the ring-shaped circumferential magnet in a radial inside of the ring-shaped circumferential magnet and a magnetic pole of the rear surface magnet on a side of the target have a polarity identical with each other.

4. An arc evaporation source, comprising:
a ring-shaped circumferential magnet and
a rear surface magnet,
wherein the ring-shaped circumferential magnet is disposed surrounding an outer circumference of a target such that a direction of magnetization of the ring-shaped circumferential magnet is along a direction parallel with a front surface of the target,
the rear surface magnet is disposed at a back of the target such that a direction of magnetization of the rear surface magnet is along a direction crossing the front surface of the target,
a magnetic pole in a radial inside of the ring-shaped circumferential magnet and a magnetic pole of the rear surface magnet on a target side have a polarity identical with each other, and
wherein the ring-shaped circumferential magnet is disposed such that a projection shadow as viewed in a radial direction of the ring-shaped circumferential magnet overlaps a projection shadow as viewed in a radial direction of the target.

5. An arc evaporation source, comprising:
a ring-shaped circumferential magnet and
a rear surface magnet,
wherein the ring-shaped circumferential magnet is disposed surrounding an outer circumference of a target such that a direction of magnetization of the ring-shaped circumferential magnet is along a direction parallel with a front surface of the target,
the rear surface magnet is disposed at a back of the target such that a direction of magnetization of the rear surface magnet is along a direction crossing the front surface of the target,
a magnetic pole in a radial inside of the ring-shaped circumferential magnet and a magnetic pole of the rear surface magnet on a target side have a polarity identical with each other, and
wherein the ring-shaped circumferential magnet is disposed such that an intermediate position between a front end of the ring-shaped circumferential magnet and a rear end of the ring-shaped circumferential magnet is situated behind an intermediate position between the front surface of the target and a rear surface of the target.

6. The arc evaporation source according to claim 4, further comprising:
a ring-shaped magnetic field generating mechanism that generates a magnetic field in a direction identical with that of the rear surface magnet,
wherein the ring-shaped magnetic field generating mechanism is disposed ahead of the target so as to pass lines of magnetic force that have passed the front surface of the target from an inner circumferential surface of the ring-shaped magnetic field generating mechanism to the radial inside.

7. The arc evaporation source according to claim 4,
wherein the ring-shaped magnetic field at the front surface of the target is 100 gauss or more.

8. An arc evaporation source comprising:
a ring-shaped circumferential magnet,
a rear surface magnet, and
a ring-shaped magnetic field generating mechanism,
wherein the ring-shaped circumferential magnet is disposed at a back of a rear surface of a target such that a direction of magnetization of the ring-shaped circumferential magnet is along a direction parallel with a front surface of the target,
the rear surface magnet is disposed such that a direction of magnetization of the rear surface magnet crosses the front surface of the target,
a magnetic pole in a radial inside of the ring-shaped circumferential magnet and a magnetic pole of the rear surface magnet on a target side have a polarity identical with each other, and
the ring-shaped magnetic field generating mechanism is disposed ahead of the target so as to generate a magnetic field in a direction identical with that of the rear surface magnet and cause lines of magnetic force that have passed the front surface of the target to pass the radial inside of the ring-shaped magnetic field generating mechanism.

9. The arc evaporation source according to claim 4,
wherein the target is in a disk-like shape,
the rear surface magnet comprises a solenoid coil, and
the ring-shaped circumferential magnet comprises a permanent magnet.

10. An arc evaporation source, comprising:
a ring-shaped circumferential magnet and
a ring-shaped rear surface magnet,
wherein the ring-shaped circumferential magnet is disposed surrounding an outer circumference of a target and has a polarity where a direction of magnetization is along a direction crossing a front surface of the target and directed ahead or behind,
the ring-shaped rear surface magnet is disposed at a back of the target, has an inner diameter larger than that of the target, and has a polarity where the direction of magnetization is parallel with the front surface of the target, and
a direction of magnetization of the ring-shaped rear surface magnet is directed to a radial inside of the ring-shaped rear surface magnet when a direction of magnetization of the ring-shaped circumferential magnet is directed ahead, and
the direction of magnetization of the ring-shaped rear surface magnet is directed to a radial outside of the ring-shaped rear surface magnet when the direction of magnetization of the ring-shaped circumferential magnet is directed behind.

11. The arc evaporation source according to claim 10,
wherein a front end of the ring-shaped circumferential magnet is disposed so as to be on a plane identical with the front surface of the target, or ahead of the front surface of the target.

12. The arc evaporation source according to claim 10,
wherein the ring-shaped rear surface magnet has a ring-shaped first rear surface magnet and a second rear surface magnet having a polarity identical with a direction of magnetization of the ring-shaped first rear surface magnet, and
the second rear surface magnet is disposed coaxially with the ring-shaped first rear surface magnet at a back of the target and ahead or behind the ring-shaped first rear surface magnet.

13. The arc evaporation source according to claim 12,
wherein a magnetic body that penetrates the ring-shaped first rear surface magnet and the second rear surface magnet is disposed to the radial inside of the ring-shaped first rear surface magnet and the second rear surface magnet, and
the ring-shaped circumferential surface of the ring-shaped magnetic body is in contact with an inner circumferential surface of the ring-shaped first rear surface magnet and that of the second rear surface magnet.

14. The arc evaporation source according to claim 4, wherein the target is in a disk-like shape and the rear surface magnet and the ring-shaped circumferential magnet each comprise a permanent magnet.

* * * * *